US009417529B2

(12) United States Patent
Matsuoka et al.

(10) Patent No.: US 9,417,529 B2
(45) Date of Patent: *Aug. 16, 2016

(54) COATING AND DEVELOPING APPARATUS AND METHOD

(71) Applicant: TOKYO ELECTRON LIMITED, Tokyo (JP)

(72) Inventors: Nobuaki Matsuoka, Koshi (JP); Akira Miyata, Koshi (JP); Shinichi Hayashi, Koshi (JP); Suguru Enokida, Koshi (JP); Hiroshi Tomita, Koshi (JP); Makoto Hayakawa, Koshi (JP); Tatsuhei Yoshida, Tokyo (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/626,295

(22) Filed: Feb. 19, 2015

(65) Prior Publication Data

US 2015/0219994 A1    Aug. 6, 2015

Related U.S. Application Data

(63) Continuation of application No. 13/177,997, filed on Jul. 7, 2011, now Pat. No. 8,985,880.

(30) Foreign Application Priority Data

Jul. 9, 2010    (JP) .................. 2010-156568

(51) Int. Cl.
*G03B 27/52*    (2006.01)
*G03F 7/16*    (2006.01)
*H01L 21/67*    (2006.01)

(52) U.S. Cl.
CPC .............. *G03F 7/16* (2013.01); *H01L 21/6715* (2013.01)

(58) Field of Classification Search
CPC ............ G03F 7/3021; H01L 21/67178; H01L 21/67184; G03B 17/50; G03D 13/003; C23C 16/52; C23C 14/541; C23C 16/46; B05C 9/14; B05B 13/0221; B05B 3/0486; C04B 41/52
USPC ................ 396/611, 564; 355/27; 118/666, 66
See application file for complete search history.

(56) References Cited

U.S. PATENT DOCUMENTS 7,379,785 B2    5/2008  Higashi et al.
7,474,377 B2    1/2009  Matsuoka et al.
(Continued)

FOREIGN PATENT DOCUMENTS

EP    2 405 476 A2    1/2012
JP    2007-115831 A1    5/2007

OTHER PUBLICATIONS

Extended European Search Report (Application No. 11173234.3) dated Mar. 4, 2015.
(Continued)

*Primary Examiner* — Rochelle-Ann J Blackman
(74) *Attorney, Agent, or Firm* — Burr & Brown, PLLC

(57) ABSTRACT

In one embodiment, a coating and developing apparatus includes a processing block having two early-stage coating unit blocks, two later-stage coating unit blocks and two developing unit blocks, each unit blocks being vertically stacked on each other, The apparatus has at least two operation modes M1 and M2 adapted for abnormality. In mode M1 the processing module that processed the abnormal substrate in the developing unit blocks is identified, and subsequent substrates are transported to the processing module or modules, of the same type as the identified processing module, other than the identified processing module. In mode M2, the developing unit block that processed the abnormal substrate is identified, and subsequent substrates are transported to the developing unit block other than the identified developing unit block.

12 Claims, 19 Drawing Sheets

(56) References Cited

U.S. PATENT DOCUMENTS

| | | |
|---|---|---|
| 7,645,081 B2 | 1/2010 | Hara et al. |
| 7,661,894 B2 | 2/2010 | Matsuoka et al. |
| 8,985,880 B2 * | 3/2015 | Matsuoka ............ G03F 7/16 355/27 |
| 2004/0037677 A1 | 2/2004 | Koyama et al. |
| 2006/0164613 A1 | 7/2006 | Akimoto et al. |
| 2007/0056514 A1 | 3/2007 | Akimoto et al. |
| 2008/0014333 A1 | 1/2008 | Matsuoka et al. |
| 2008/0299502 A1 | 12/2008 | Shin et al. |

OTHER PUBLICATIONS

Singaporean Search and Examination Report (Application No. 201105011-9) dated Feb. 2, 2014.

* cited by examiner

| | ADH | BCT | HP100~HP209 | COT | HP100~HP209 | WEE | TCT | HP300~HP411 | BST |
|---|---|---|---|---|---|---|---|---|---|
| WAFER A1 | 1 | 1 | 100 | 1 | 101 | 1 | 1 | 300 | 1 |
| WAFER A2 | 3 | 3 | 200 | 3 | 201 | 3 | 3 | 400 | 3 |
| WAFER A3 | 2 | 2 | 102 | 2 | 103 | 2 | 2 | 301 | 2 |
| WAFER A4 | 4 | 4 | 202 | 4 | 203 | 4 | 4 | 401 | 4 |
| WAFER A5 | 1 | 1 | 104 | 1 | 105 | 1 | 1 | 302 | 1 |
| WAFER A6 | 3 | 3 | 204 | 3 | 205 | 3 | 3 | 402 | 3 |
| --- | --- | --- | --- | --- | --- | --- | --- | --- | --- |

| | HP500~HP611 | DEV1~DEV8 | HP500~HP611 |
|---|---|---|---|
| WAFER A1 | 500 | 1 | 501 |
| WAFER A2 | 600 | 5 | 601 |
| WAFER A3 | 502 | 2 | 503 |
| WAFER A4 | 602 | 6 | 603 |
| WAFER A5 | 504 | 3 | 505 |
| WAFER A6 | 604 | 7 | 605 |
| --- | --- | --- | --- |

| TRANSPORT STOP CRITERIA | INSPECTION ITEM | | | | | | RELEVANT MODULE | RELEVANT UNIT BLOCK |
|---|---|---|---|---|---|---|---|---|
| | PATTERN COLLAPSE | POOR RESIST DISSOLUTION | BUBBLES AFTER DEVELOPMENT | | SCUM DEFECT | | | |
| | 2/5 | 1/5 | 1/5 | --- | IMMEDIATE STOP | | | |
| WAFER A1 | NONE | NONE | NONE | --- | NONE | | | |
| WAFER A2 | NONE | NONE | NONE | --- | NONE | | | |
| WAFER A3 | NONE | FOUND | NONE | --- | NONE | | DEV1---- | B1, B3, B5 |
| WAFER A4 | NONE | NONE | NONE | --- | NONE | | | |
| WAFER A5 | NONE | NONE | FOUND | --- | NONE | | DEV5---- | B2, B4, B6 |
| WAFER A6 | NONE | NONE | NONE | --- | --- | | | |
| --- | --- | --- | --- | --- | --- | | --- | --- |

COATING AND DEVELOPING APPARATUS AND METHOD

CROSS REFERENCE TO RELATED APPLICATIONS

This application is a continuation of U.S. application Ser. No. 13/177,997 filed Jul. 7, 2011 and claims the benefit under 35 USC §119(a)-(d) of Japanese Patent Application No 2010-156568 filed Jul. 9, 2010, the entireties of which are incorporated herein by reference.

FIELD OF THE INVENTION

The present disclosure relates to a coating and developing apparatus and method for applying a resist to a substrate and developing the resist after exposure.

BACKGROUND OF THE INVENTION

A semiconductor manufacturing process includes a photolithography process comprising applying a photoresist (hereinafter simply referred to as a resist) to a surface of a semiconductor wafer (hereinafter simply referred to as a wafer), exposing the resist in a predetermined pattern, and developing the exposed resist to form a resist pattern. A coating and developing apparatus for forming such a resist pattern includes a processing block having processing modules for performing various types of processing of a wafer.

The processing block is comprised of a stack of unit blocks for forming various types of coating films (e.g. resist film) and unit blocks for performing developing processing, as described e.g. in Japanese Patent Laid-Open Publication No. 2007-115831. A wafer undergoes processing in various processing modules, provided in each unit block, according to a predetermined order.

In order to meet recent demands for finer resist patterns, increased yield, etc., processing modules provided in a processing block are becoming diversified, For example, besides a resist film-forming module for applying a resist onto a substrate, such as a wafer, and a developing module for supplying a developer to the substrate, a processing block may also be provided with a back surface cleaning module for cleaning the back surface of the substrate after resist coating and an upper film-forming liquid processing module for supplying a chemical solution onto the resist film to further form a film, With an increased number of diverse processing modules provided in a processing block of a coating and developing apparatus, there is a problem of how to reduce the increase in the footprint of the apparatus.

Stacking a plurality of unit blocks in a coating and developing apparatus, as described above, is effective for reducing the footprint of the apparatus, However, because a wafer is transported sequentially to the unit blocks, the operation of the entire coating and developing apparatus must be stopped when an abnormality occurs in one processing module or one unit block, or when performing maintenance of one processing module or one unit block. This significantly lowers the operation efficiency of the apparatus.

SUMMARY OF THE INVENTION

The present disclosure provides a technique which can reduce the increase in the footprint of a processing block and which can reduce the lowering of the operation efficiency of a coating and developing apparatus upon the occurrence of an abnormality or upon maintenance.

In one embodiment, there is provided a coating and developing apparatus comprising a carrier block, a processing block and an interface block connectable to an exposure apparatus, said coating and developing apparatus being configured to transfer a substrate, which has been carried by a carrier into the carrier block, to the processing block, form at least two coating films, including a resist film, on the substrate n the processing block, send the substrate to the exposure apparatus via the interface block, develop the substrate after exposure which has returned via the interface block, in the processing block, and transfer the substrate to the carrier block, wherein (a) the processing block includes two early-stage coating unit blocks vertically stacked on each other, two later-stage coating unit blocks vertically stacked on each other and two developing unit blocks vertically stacked on each other; the two early-stage coating unit blocks, the two later-stage coating unit blocks and the two developing unit blocks are stacked on each other; each early-stage coating unit block is configured to perform the same coating processing of a substrate, has a plurality of processing modules, including liquid processing modules for forming at least one lower coating film of the coating films necessary for exposure and heating modules for heating the substrate, and is provided with a transport mechanism that moves along a linear transport passage, extending from a carrier block side to an interface block side, to transport the substrate between the processing modules; each later-stage coating unit block is configured to perform the same processing of a substrate, has a plurality of processing modules, including liquid processing modules for forming at least one upper coating film of the coating films necessary for exposure and heating modules for heating the substrate, and is provided with a transport mechanism that moves along a linear transport passage, extending from the carrier block side to the interface block side, to transport the substrate between the processing modules; and each developing unit block is configured to perform the same processing of a substrate, has a plurality of processing modules, including developing modules for supplying a developer to the substrate and heating modules for heating the substrate, and is provided with a transport mechanism that moves along a linear transport passage, extending from the carrier block side to the interface block side, to transport the substrate between the processing modules;

(b) either the early-stage coating unit blocks or the later-stage coating unit blocks include, as the liquid processing modules, resist film-forming modules for forming a resist film on a substrate;

said coating and developing apparatus further includes:

(c) transfer units, each of which is, respectively, provided on the carrier block side of the early-stage coating unit blocks, the later-stage coating unit blocks and the developing unit blocks, for transferring a substrate to and from the transport mechanisms of the associated unit blocks, respectively;

(d) a first transfer mechanism configured to transfer substrates to the transfer units, respectively, such that the substrates are distributed from the carrier to the transfer units associated with the early-stage coating unit blocks, configured to return a substrate from each of the transfer units associated with the developing unit blocks to the carrier, and configured to transfer substrates, which have been processed in the early-stage coating unit blocks, to the transfer units associated with the later-stage coating unit blocks, respectively;

(e) a second transfer mechanism configured to receive substrates before exposure which have been processed in the processing block, and configured to transfer substrates after exposure to the developing unit blocks, respectively, such that the substrates are distributed to the developing unit blocks;

(f) a post-development inspection module for inspecting a substrate after development;

(g) a storage section for storing data on a transfer route along which a substrate, selected as an inspection object, has been transported until the substrate undergoes inspection in the post-development inspection module; and (h) a mode selection section which is provided to select, when an abnormality in a substrate is detected upon inspection by the post-development inspection module, a mode for transport of subsequent substrates from a mode group adapted for abnormality after development, including mode M1 and mode M2, based on data stored in the storage section, wherein the mode M1 is a mode which identifies a processing module that processed the substrate having an abnormality in the developing unit blocks, and which controls operation of the transport mechanism of the developing unit block to which the identified processing module belongs such that subsequent substrates are transported to a processing module or modules, of the same type as the identified processing module, other than the identified processing module, and wherein the mode M2 is a mode which identifies a developing unit block that processed the substrate having an abnormality, and which controls operation of the second transfer mechanism such that subsequent substrates are transported to the developing unit block other than the identified developing unit block.

In another embodiment, there is provided a coating and developing method to be carried out in a coating and developing apparatus, the apparatus comprising a carrier block, a processing block, and an interface block connectable to an exposure apparatus, said coating and developing apparatus being configured to transfer a substrate, which has been carried by a carrier into the carrier block, to the processing block, form at least two coating films, including a resist film, on the substrate in the processing block, send the substrate to the exposure apparatus via the interface block, develop the substrate after exposure, which has returned via the interface block, in the processing block, and transfer the substrate to the carrier block, wherein (a) the processing block includes two early-stage coating unit blocks vertically stacked on top of each other, two later-stage coating unit blocks vertically stacked on top of each other and stacked on the early-stage coating unit blocks, and two developing unit blocks vertically stacked on top of each other and stacked on the early-stage coating unit blocks; each early-stage coating unit block is configured to perform the same coating processing of a substrate, has a plurality of processing modules, including liquid processing modules for forming at least one lower coating film of the coating films necessary for exposure and heating modules for heating the substrate, and is provided with a transport mechanism that moves along a linear transport passage extending from the carrier block side to the interface block side, to transport the substrate between the processing modules; each later-stage coating unit block is configured to perform the same processing of a substrate, has a plurality of processing modules, including liquid processing modules for forming at least one upper coating film of the coating films necessary for exposure and heating modules for heating the substrate, and is provided with a transport mechanism that moves along a linear transport passage, extending from the carrier block side to the interface block side, to transport the substrate between the processing modules; and each developing unit block is configured to perform the same processing of a substrate, has a plurality of processing modules, including developing modules for supplying a developer to the substrate and heating modules for heating the substrate, and is provided with a transport mechanism that moves along a linear transport passage, extending from the carrier block side to the interface block side, to transport the substrate between the processing modules;

(b) either the early-stage coating unit blocks or the later-stage coating unit blocks include, as the liquid processing modules resist film-forming modules for forming a resist film on a substrate;

said coating and developing apparatus further includes:

(c) transfer units, each of which is, respectively, provided on the carrier block side of the early-stage coating unit blocks, the later-stage coating unit blocks and the developing unit blocks, for transferring a substrate to and from the transport mechanisms of the associated unit blocks, respectively;

(d) a first transfer mechanism configured to transfer substrates to the transfer units, respectively, such that the substrates are distributed from the carrier to the transfer units associated with the early-stage coating unit blocks, configured to return a substrate from each of the transfer units associated with the developing unit blocks to the carrier, and configured to transfer substrates, which have been processed in the early-stage coating unit blocks, to the transfer units associated with the later-stage coating unit blocks, respectively;

(e) a second transfer mechanism configured to receive substrates before exposure which have been processed in the processing block, and configured to transfer substrates after exposure to the developing unit blocks, respectively, such that the substrates are distributed to the developing unit blocks;

(f) a post-development inspection module for inspecting a substrate after development;

said coating and developing method comprising:

a post-development inspection step that inspects a substrate after development by the post-development inspection module;

a storing step that stores in a storage section data on a transport route along which the substrate, as an inspection object, was transported to the post-development inspection module;

an identifying step that identifies, when an abnormality in the substrate is detected upon inspection by the post-development inspection module, a processing module or modules that processed the substrate in the developing unit blocks, based on data stored in the storage section; and a controlling step that controls operation of the transport mechanism of the developing unit block such that subsequent substrates are transported to a processing module or modules, of the same type as the identified processing module, other than the identified processing module.

In yet another embodiment, there is provided a non-transitory storage medium in which a computer program for use in a coating and developing apparatus is stored, the computer program being for executing the aforementioned coating and developing method,

BRIEF DESCRIPTION OF THE DRAWINGS

FIG. 8 is a diagram showing data in a memory of the control section;

FIG. 9 is a diagram showing data in a memory of the control section;

DETAILED DESCRIPTION OF THE INVENTION

First Embodiment

Figure 1:
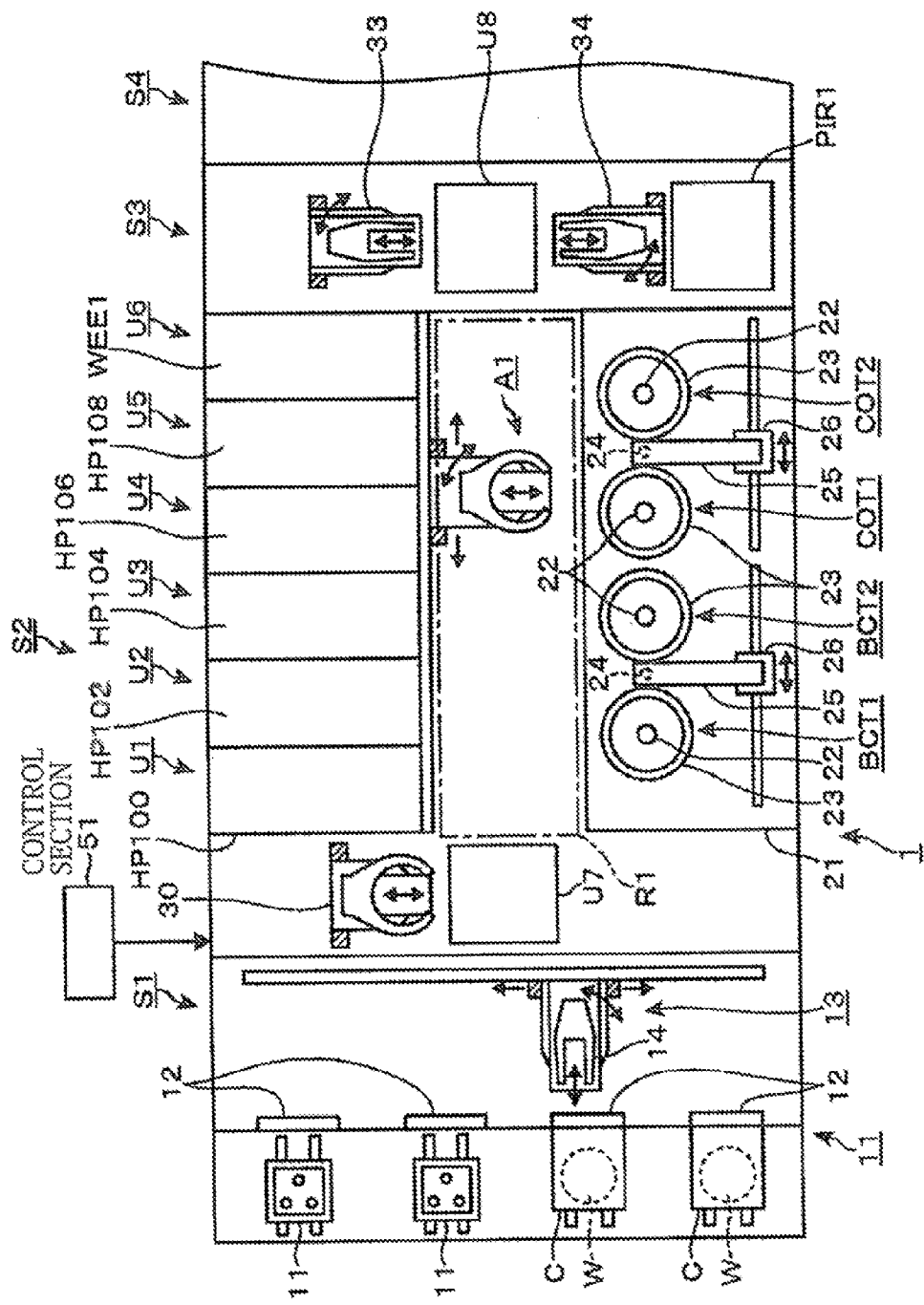
FIG. 1 is a plan view of a coating and developing apparatus in one embodiment.
Figure 2:
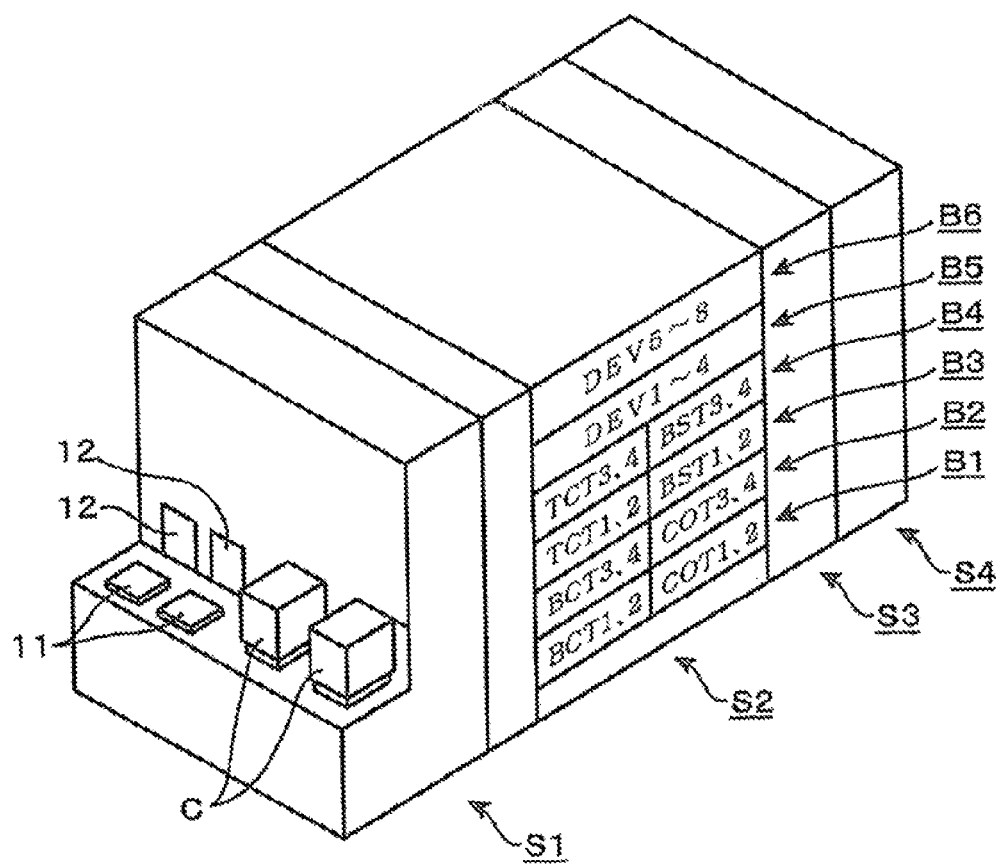
FIG. 2 is a perspective view of the coating and developing apparatus.

The construction of a coating and developing apparatus will now be described with reference to FIGS. 1 to 3. The coating and developing apparatus 1 includes a carrier block S1 for receiving and delivering carriers C in each of which a plurality of, for example 25, wafers W are hermetically housed, a processing block S2 for performing processing of the wafers W, and an interface block S3, the blocks being arrayed linearly, To the interface block S3 is connected to an exposure apparatus S4 for performing immersion exposure. For the convenience of description of positional relationships in a plan view of the apparatus, the right side of FIG. 1 is hereinafter referred to as "anterior", the left side as "posterior", the upper side as "left", and the lower side as "right".

The carrier block S1 includes stages 11 for placing carriers C thereon, shutters 12 provided in a wall in front of the stages 11, and a transfer arm 13 for taking wafers W out of the carriers C via the shutters 12. The transfer arm 13 has five wafer holders 14 arranged in the vertical direction, and is configured to be movable back and forth, vertically movable, rotatable on a vertical axis and movable in the carrier C arrangement direction. The below-described control section assigns ID numbers to wafers W in each carrier C, and the transfer arm 13 transfers the wafers W to a transfer module BU1 of the processing block S2 in a sequential manner such that 5 wafers are transferred at a time and that the wafers W are transferred in order of increasing ID number.

An element having a site on which a wafer W can be placed is herein referred to as "module". A module for carrying out processing of a wafer W, such as heating, processing with a liquid, supply of a gas, peripheral exposure, etc., is herein referred to as "processing module"; and a processing module for supplying a processing liquid, such as a chemical solution or a cleaning liquid, is herein referred to as "liquid processing module".

Figure 4:
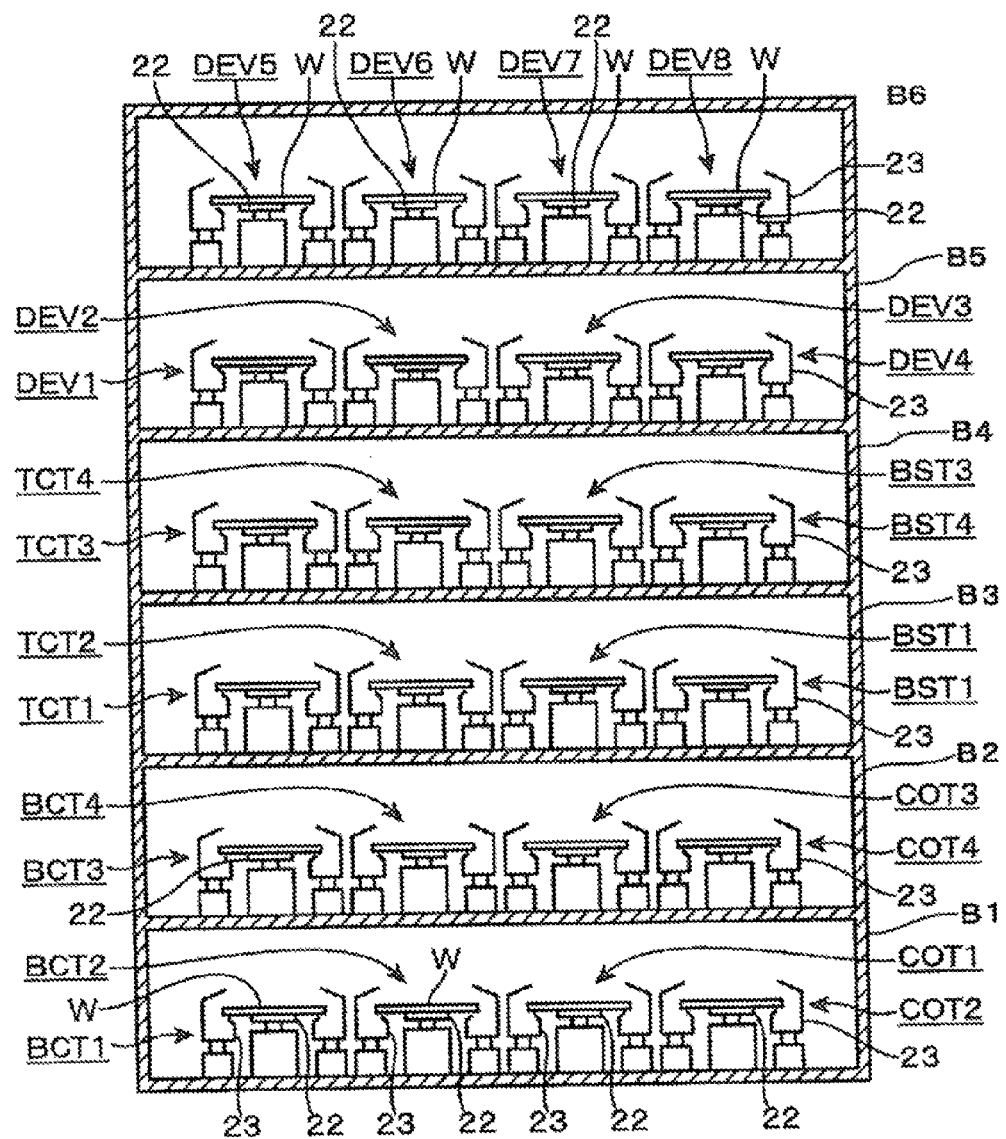
FIG. 4 is a vertical sectional side view of the processing block of the coating and developing apparatus.

The processing block S2 is connected to the carrier block S1. The processing block S2 consists of first to sixth unit blocks B1 to B6 which are stacked in this order and are each designed to perform particular liquid processing. The processing block S2 will be further described below with reference also to FIG. 4 which is a schematic vertical sectional side view of the processing block S2.

The first unit block B1 and the second unit block B2, which are early-stage coating unit blocks for carrying out early-stage processing (processing to form a lower film(s) of coating films necessary for exposure processing) of a sequence of coating film-forming steps, have substantially the same construction and perform the formation of an antireflection film on a wafer W and the formation of a resist film on the wafer W. The third unit block B3 and the fourth unit block B4, which are later-stage coating unit blocks for carrying out later-stage processing (processing to form an upper film(s) of coating films necessary for exposure processing) of a sequence of coating film-forming steps, have substantially the same construction and perform the formation of a protective film for immersion exposure and perform cleaning of the back surface of the wafer W. The fifth unit block B5 and the sixth unit block B6, which are unit blocks for developing processing, have substantially the same construction and perform developing processing of the wafer W after immersion exposure. That is, the processing block S2 includes three pairs of unit blocks, each pair including two unit blocks which are stacked in two layers and have the same task (the same processing to wafers). The first to fourth unit blocks B1 to B4 are herein sometimes referred to as coating film-forming unit blocks, and the fifth and sixth blocks B5 and B6 as developing unit blocks.

The unit blocks B1 to B5 each have a liquid processing module, a heating module, a main arm A which is a transport means for each unit block, and a transport region R1 in which the main arm A moves. The modules, the main arm and the layout of the transport region are substantially the same among the unit blocks. A wafer W is transported by the main arm A and is subjected to processing in each unit block independently of the other blocks. The transport region R1 is a linear transport passage extending from the carrier block S1 to the interface block S3. Only the first unit block B1 is shown in FIG, 1, and the following description illustrates the unit block B1 as a representative. The transport region R1 is formed in the center of the first unit block B1. A liquid processing unit 21 is disposed on the right of the transport region R1, and shelf units U1 to U6 are disposed on the left of the transport region R1.

The liquid processing unit 21 is provided with antireflection film-forming modules BCT1, BCT2 and resist film-forming modules COT1, COT2. The modules BCT1, BCT2, COT1 and COT2 are arranged in this order from the side of the carrier block S1 to the side of the interface block S3. The antireflection film-forming modules BCT1, BCT2 and the resist film-forming modules COT1, COT2 each include a spin chuck 22. The spin chuck 22 is capable of attracting and holding a central portion of the back surface of a wafer W and is rotatable on a vertical axis. A top-open processing cup 23 surrounds the periphery of the spin chuck 22 and prevents scattering of a chemical solution. Upon processing of a wafer W the wafer W is housed in the processing cup 23, with the central portion of the back surface of the wafer W being held by the spin chuck 22.

The antireflection film-forming modules BCT1, BCT2 are provided with a nozzle 24 which is shared by the modules. The nozzle 24 is supported by an arm 25 A drive mechanism 26, via the arm 25, moves the nozzle 24 in the arrangement direction of the processing cups 23 and vertically moves the nozzle 24. Thus, the nozzle 24 can be moved by means of the drive mechanism 26 between a position above the cup 23 of the antireflection film-forming module BCT1 and a position above the cup 23 of the antireflection film-forming module BCT2. The nozzle 24 can therefore eject an antireflection film-forming chemical solution toward the center of a wafer W held by each spin chuck 22. The chemical solution, which has been supplied from the nozzle 24 to the wafer W, spreads to the periphery of the wafer W due to centrifugal force caused by the rotation of the wafer W on a vertical axis, whereby an antireflection film is formed on the wafer W. Though not depicted, the antireflection film-forming modules BCT1, BCT2 are provided with a nozzle for supplying a solvent to a peripheral portion of a wafer W to remove an unnecessary film in the peripheral portion.

The resist film-forming modules COT1, COT2 have substantially the same mechanical construction as the antireflection film-forming modules BCT1, BCT2. Thus, the resist film-forming modules COT1, COT2 each have a processing cup 23 for processing of a wafer W and have a spin chuck 22, and the two processing cups 23 and the two spin chucks 22 share one nozzle 24. Instead of the antireflection film-forming chemical solution, a resist is supplied from the nozzle 24. Though the liquid processing modules have been described such that "one liquid processing module has one processing cup 23 (spin chuck 22) and two processing modules share one nozzle 24", it is also possible to regard the liquid processing modules as having the construction that "one liquid processing module has one nozzle 24 and two processing cups 23 (spin chucks 22)".

The shelf units U1 to U6 are arranged in this order from the side of the carrier block S1 to the side of the interface block S3. The shelf units U1 to U5 are each comprised of heating modules, stacked e.g. in two stages, for performing heating of a wafer W. Each heating module includes a hot plate for heating a wafer W and a cooling plate for cooling the wafer W after the heating. The unit block B1 thus has 10 heating modules HP100 to HP109, The shelf nit U6 is comprised of a stack of peripheral exposure modules WEE1, WEE2 for performing peripheral exposure of a wafer W after resist coating. The main arm A1 is provided in the transport region R1. The main arm A1 is configured to be movable back and forth, vertically movable, rotatable on a vertical axis and movable in the longitudinal direction of the processing block S2, so that a wafer W can be transferred between all the modules of the unit block B1.

The other unit blocks will now be described. The second unit block B2 has the same construction as the above-described first unit block B1 and is provided with antireflection film-forming modules BCT3, BCT4 and resist film-forming modules COT3, COT4, The shelf units U1 to U5 are comprised of 10 heating modules HP200 to HP209. The shelf unit U6 is comprised of two peripheral exposure modules WEE3, WEE4.

The construction of the third unit block B3 is similar to the construction of the first unit block B1, but differs in that immersion exposure protective film-forming modules TCT1, TCT2 are provided instead of the antireflection film-forming modules BCT1, BCT2 and that back surface cleaning modules BST1, BST2 are provided instead of the resist film-forming modules COT1, COT2. The protective film-forming modules TCT1, TCT2 have the same mechanical construction as the antireflection film-forming modules BCT1, BCT2 except that a chemical solution for the formation of a water-repellent protective film is supplied to a wafer W. The protective film-forming modules TCT1, TCT2 each have a processing cup 23 for processing of a wafer W and have a spin chuck 22, and a nozzle 24 is shared by the two processing cups 23 and the two spin chucks 22.

The back surface cleaning modules BST1, BST2 are not provided with a nozzle 24 for supplying a chemical solution to the front surface of a wafer W. but instead are each provided with a nozzle for supplying a cleaning liquid to the back surface and a peripheral bevel portion of a wafer W to clean the back surface of the wafer W. Except for this difference, the back surface cleaning modules BST1, BST2 have the same mechanical construction as the antireflection film-forming modules BCT1, BCT2. The back surface cleaning modules BST1, BST2 may be configured to clean only the back surface of a wafer W or only the bevel portion. Further, the back surface cleaning modules BST1, BST2 may be configured to scrub clean the back surface of a wafer W by using a brush member in addition to a cleaning liquid. The shelf unit U6 of the third unit block B3 is comprised of heating modules instead of the peripheral exposure modules WEE. Thus, the shelf units U1 to U6 of the third unit block B3 are comprised of heating modules 300 to 311.

The fourth unit block B4 has the same construction as the above-described third unit block B3 and is provided with protective film-forming modules TCT3, TCT4 and back surface cleaning modules BST3, BST4. The shelf units U1 to U6 of the fourth unit block B4 are comprised of heating modules HP400 to HP411.

The construction of the fifth unit block B5 is similar to the construction of the first unit block B1, but differs in that developing modules DEV1 to DEV4 are provided instead of the antireflection film-forming modules BCT1, BCT2 and the resist film-forming modules COT1, COT2. Each developing module (DEV1 to DEV4) has the same mechanical construction as each resist film-forming module (COT1, COT2) except that instead of the resist, a developer is supplied to a wafer W. The shelf units U1 to U6 of the fifth unit block B5 are comprised of heating modules HP500 to HP511.

The sixth unit block B6 has the same construction as the unit block B5 and is provided with developing modules DEV5 to DEV8. The shelf units to U6 of the sixth unit block B6 are comprised of heating modules HP600 to HP611. Note that the reference signs designating the antireflection film-forming modules (BCT1 to BCT4), the resist film-forming modules (COT1 to COT4), the protective film-forming modules (TCT1 to TCT4), the back surface cleaning modules (BST1 to BST4) and the developing modules (DEV1 to DEV8) are sometimes simplified by removing the numeral part thereof (e.g., COT1→COT) in a case where there is no need to distinguish individual modules from each other, In the liquid processing unit 21 of each unit block, a chemical solution which has been supplied to a wafer W is discharged toward a not-shown drainage path provided e.g., below the coating and developing apparatus. The chemical solutions supplied to wafers W in the antireflection film-forming modules BCT, the resist film-forming modules COT and the protective film-forming modules TCT have a higher viscosity than a developer. Accordingly, all the chemical solutions can be rapidly discharged by disposing the developing modules DEV in the upper unit blocks and disposing the other liquid processing modules in the lower unit blocks as in this embodiment. This can prevent vaporization of the chemical solutions in the processing modules, thereby preventing a change in the processing environment in each liquid processing unit 21.

Figure 3:
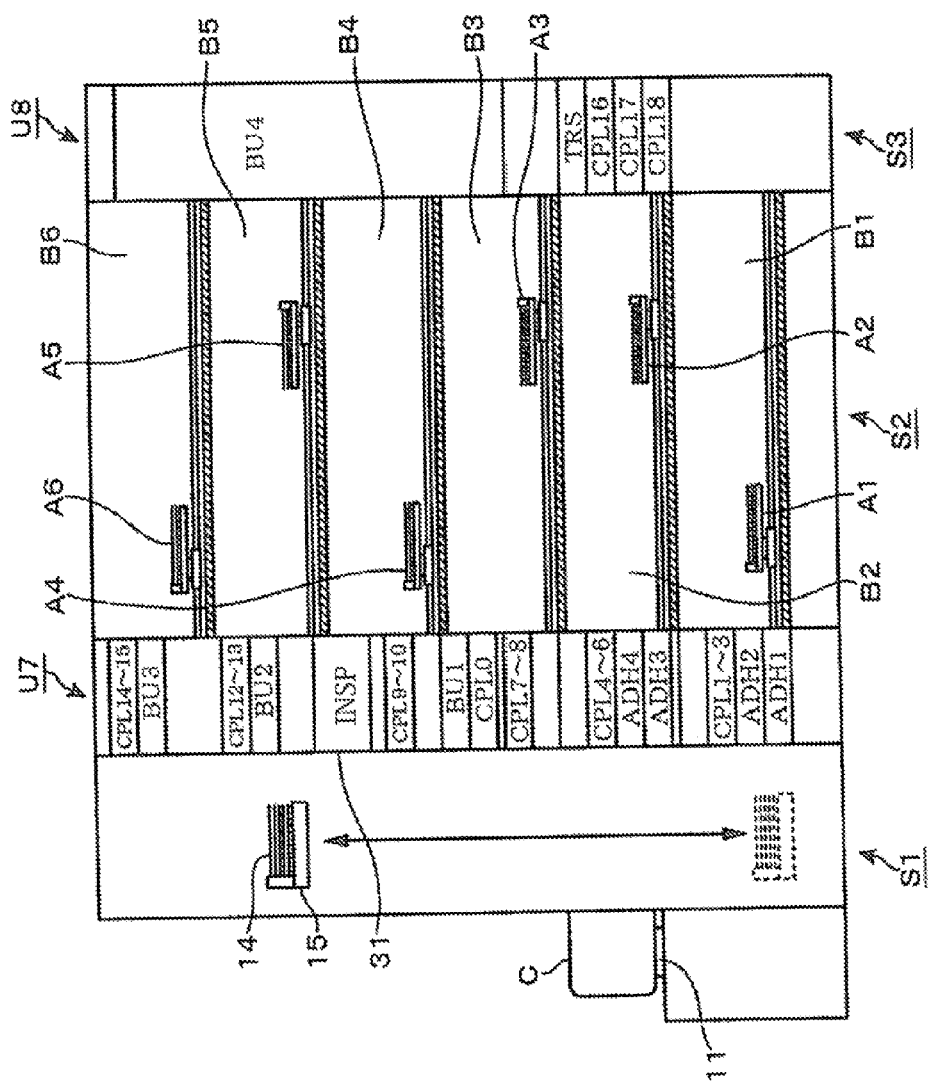
FIG. 3 is a vertical sectional side view of the coating and developing apparatus.

As shown in FIGS. 1 and 3, a shelf unit U7, vertically extending across the unit blocks B1 to B6, is provided on the carrier block S1 side of the transport region R1. The construction of the shelf unit U7 will now be described. The shelf unit U7 is comprised of a stack of a plurality of modules. Hydrophobizing modules ADH1, ADH2 and transfer modules CPL1 to CPL3 are provided in height positions accessible by the main arm A1 of the first unit block B1. Hydrophobizing modules ADH3, ADH4 and transfer modules CPL4 to CPL6 are provided in height positions accessible by the main arm A2 of the second unit block B2. A transfer module with the symbol "CPL" is provided with a cooling stage for cooling a wafer W placed on it. A transfer module with the symbol "BU" is configured to be capable of housing and retaining a plurality of wafers W.

The hydrophobizing modules ADH1 to ADH4 supply a processing gas to a wafer W to enhance the hydrophobicity of the surface of the wafer W, thereby preventing a film from peeling off the wafer W upon immersion exposure. Especially by enhancing the hydrophobicity of the bevel portion (peripheral end portion) of the wafer W, even when a film(s) is removed from the bevel portion in a liquid processing module(s) and the surface of the bevel portion becomes exposed, the exposed surface has water repellency. This can prevent the remaining film(s) from peeling at the end portion, lying adjacent to the exposed bevel portion, upon immersion exposure.

Transfer modules CPL7, CPL8 and transfer modules CPL9, CPL10 are provided in height positions accessible by the main arms A3, A4 of the unit blocks B3, B4. Further, transfer modules BU1 and CPL0 are provided in height positions accessible by the transfer arm 13 of the carrier block S1. The transfer module BU1 has vertically-arranged 5 wafer holders to receive wafers W at a time from the transfer arm 13. The transfer module CPL0 is employed to return a wafer W after development to the carrier C.

Transfer modules CPL12, CPL13 and BU2 are provided in height positions accessible by the main arm A5 of the unit block B5. Transfer modules CPL14, CPL15 and BU3 are provided in height positions accessible by the main arm A6 of the unit block B6.

The shelf unit U7 is provided with an inspection module (INSP) 31. When carrying wafers W out of the unit blocks B5, B6, those which are scheduled to be carried into the inspection module (INSP) 31, are carried into the transfer modules BU2, BU3. On the other hand, those wafers W which are not to be carried into the inspection module 31 are returned to the carrier C without carrying them into the transfer modules BU2, BU3. By thus setting a transport route for each wafer, transport of wafers W is controlled such that the wafers W return to the carrier C in order of ID number, i.e. in order of transport from the carrier C, In the processing block B2, a transfer arm 30 as a first transfer mechanism, configured to be vertically movable and movable back and forth, is provided in the vicinity of the shelf unit U7. The transfer arm 30 transports a wafer W between the modules of the shelf unit U7.

The inspection module 31 will now be described in greater detail. According to a selected inspection mode as will be described later, a wafer W after the formation of a resist film and before exposure or a wafer W after development is carried into the inspection module 31. The wafer W after the formation of a resist film and before exposure is inspected e.g. for the presence or absence of foreign matter on the resist film and the thickness of the resist film.

The wafer W after development is inspected for development-related defects. The development-related defects are classified into defects due to development and defects due to development and coating. Examples of the defects due to development may include pattern collapse, abnormal line width, poor resist dissolution, adhesion of bubbles after development, adhesion of foreign matter, bridging in a resist pattern (residual resist bridging adjacent raised portions), and pattern defect (scum defect) due to a residual dissolved product (scum). Examples of the defects due to development and coating may include pattern collapse and abnormal line width.

In this embodiment the presence or absence of each such defect is set as an inspection item. Upon implementation of a selected inspection mode as described below, the inspection module 31 sends inspection data to the below-described control section 51. Based on the inspection data, the control section 51 determines the presence or absence of each defect.

Figure 5:
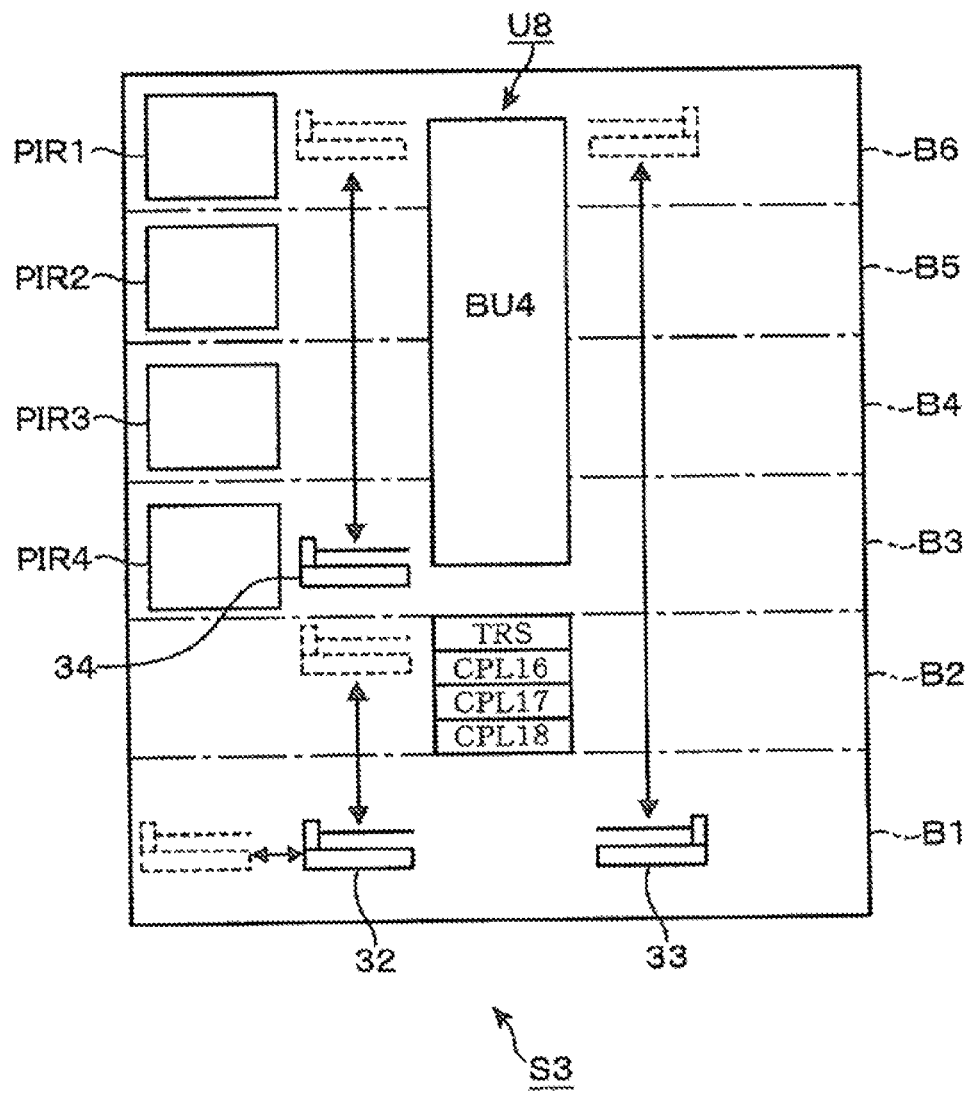
FIG. 5 is a vertical sectional front view of an interface block.

The construction of the interface block S3 will now be described with reference also to FIG. 5. The interface block S3 is provided with a shelf unit U8 in a position accessible by the main arms A1 to A6 of the unit blocks. The shelf unit U8 has a transfer module BU4 in a position corresponding to the third unit block B3 to the sixth unit block B6. The transfer module BU4 will be described in detail later. A stack of transfer modules TRS, CPL16 to CPL18 is provided under the transfer module BU4.

The interface block S3 is provided with a stack of a plurality of, for example four, post-exposure cleaning modules PIR1 to PIR4. Each post-exposure cleaning module PIR has the same mechanical construction as each resist film-forming module COT, but supplies, instead of the resist, a chemical solution for removal of a protective film and for cleaning to the surface of a wafer W.

The interface block S3 is also provided with three interface arms 32, 33, 34. The interface arms 32, 33, 34 are configured to be vertically movable and movable back and forth, and the interface arm 32 is also configured to be movable in a horizontal direction. The interface arm 32 approaches the exposure apparatus S4 and the transfer modules TRS, CPL16 to CPL18 to transfer a wafer W between them. The interface arm 33 approaches the transfer modules TRS, CPL16 to CPL18 and BU4 to transfer a wafer W between these modules. The interface arm 34 approaches the transfer module BU4 and the post-exposure cleaning modules PIR1 to PIR4 to transfer a wafer W between these modules. The interface arms 32 to 34 constitute a second transfer mechanism.

Figure 6:
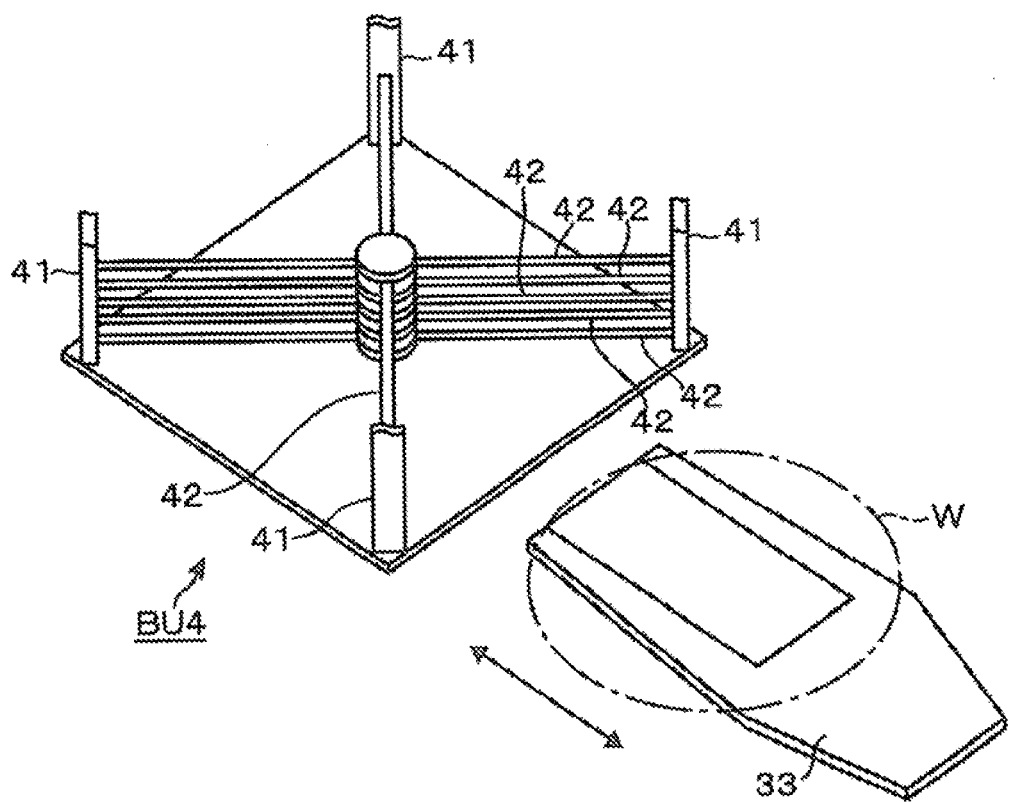
FIG. 6 is a perspective view of a transfer module provided in the interface block.

The transfer module BU will now be described with reference to FIG. 6. The transfer module BU includes circumferentially-arranged support posts 41. Wires 42 are stretched between opposing support posts 41, and two wires 42, 42 intersecting with each other make a pair. A number of such pairs are provided at different height positions, and circular support portions 43 are provided on the intersections of the wires 42, 42. Wafers W are supported in a horizontal position on the support portions 43. Though only five support portions 43 are shown in FIG. 6, a larger number of support portions are actually provided. The interface arms 33, 34 and the main arms A3 to A6 can pass between the support posts 41 and enter the module BU4, Each arm that has entered the module BU4 moves vertically and transfers a wafer W between the arm and a support portion 43. The transfer modules BU1 to BU3 have the same construction as the transfer module BU4.

Figure 7:
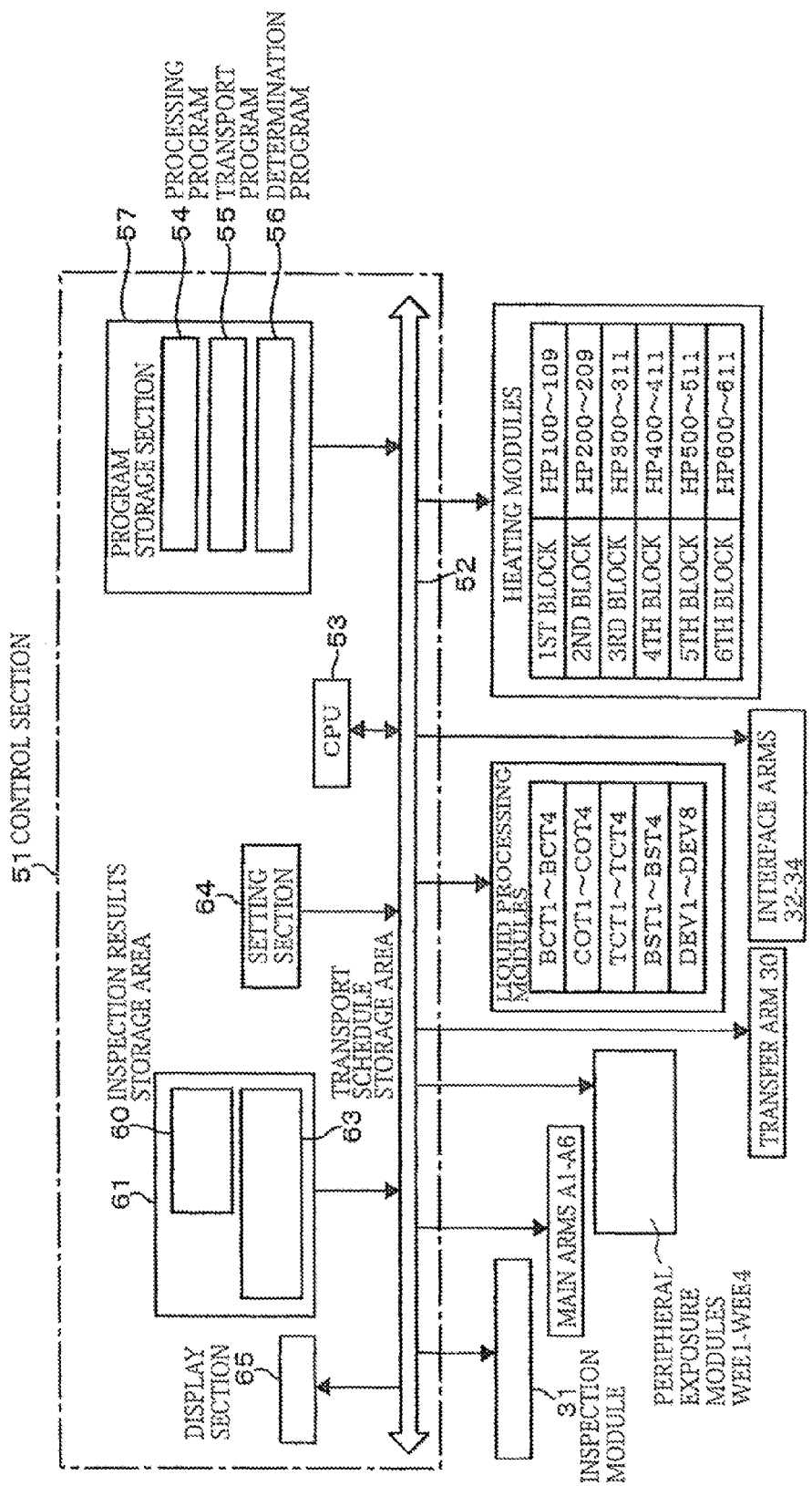
FIG. 7 is a diagram showing the construction of the control section of the coating and developing apparatus.
Figure 10:
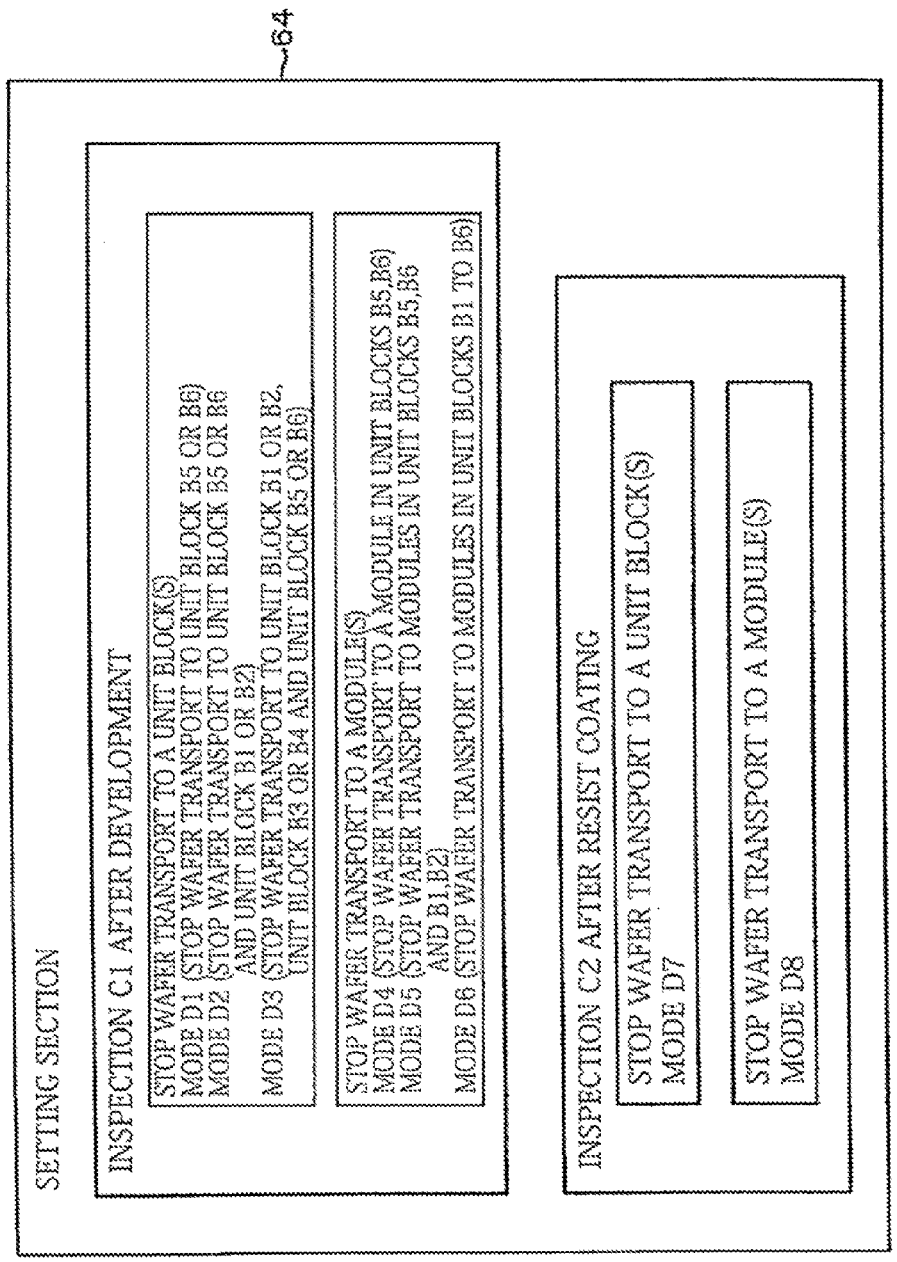
FIG. 10 is a diagram illustrating modes which are selectable via a setting section.

The control section 51 provided in the coating and developing apparatus 1 will now be described with reference to FIG. 7. A CPU53 which performs various operations is connected to a bus 52. To the bus 52 is also connected a program storage section 57 in which a processing program 54, a transport program 55 and a determination program 56 are stored. The processing program 54 causes the control section 51 to output control signals to various components of the coating and developing apparatus 1 to carry out processing of each wafer W, such as supply of a chemical solution or a cleaning liquid, heating, etc.

The transport program 55, according to a selected inspection mode and the results of determination of the determination program 56, causes the control section 51 to output control signals to the main arms A1 to A6 of the unit blocks B1 to B6, the transfer arm 30 and the interface arms 32 to 34 so as to control transport of each wafer W. The determination program 56, e.g. based on inspection data sent from the inspection module 31, determines the presence or absence of an abnormality in a processed wafer W.

A memory 61 is connected to the bus 52. A transport schedule and the results of inspection by the inspection module 31 for each wafer W are stored in the memory 61. FIG. 8 shows exemplary data to be stored in a transport schedule storage area 63 in the memory 61. The data represents a normal transport schedule as used when the inspection of the inspection module 31 find no abnormality in wafers W.

The ID of a wafer W, the modules to which the wafer W is to be transported and the order of transport to the modules are, in their relation, stored as a transport schedule in the transport schedule storage area 63. Thus, the transport schedule represents data on the transport route of each wafer. For example, the wafer with ID "A1", shown in FIG. 8, is transported to the antireflection film-forming module BCT1, the heating module HP100, the resist film-forming module COT1, the heating module HP101, the peripheral exposure module WEE1, the protective film-forming module TCT1, the heating module HP300, the back surface cleaning module BST1, the heating module 500, the developing module DEV1, and the heating module 501 in this order.

The transport schedule of this example is set such that wafers W are transported either in the order of the first unit block B1→the third unit block B3→the fifth unit block B5, or in the order of the second unit block B2→the fourth unit block B4→the sixth unit block B6. When a wafer W is transported to the first unit block B1, the next wafer W is transported to the second unit block B2, and the next wafer W is transported to the first unit block B1. Wafers W, which are successively carried out of a carrier C, are thus alternately directed to the different unit blocks.

An inspection results storage area 60 in the memory 61 will now be described with reference to FIG. 9. The inspection results storage area 60 is an area where data on the presence or absence of an abnormality in each wafer is stored for each of the above-described inspection items. For a wafer W with an abnormality, a module and a unit block which have processed the wafer W are stored in the storage area 60, as will be described later.

Transport stop criteria, set for respective inspection items, are also stored in the inspection results storage area 60. When an abnormality is detected in a wafer W, the relevant transport stop criterion is used to determine whether to stop transport of subsequent wafers W to a unit block B or a processing module which has processed the defective wafer W. The stop of wafer transport is implemented when the frequency of the occurrence of abnormality meets the transport stop criterion.

The transport stop criteria will now be described taking the criterion set for pattern collapse, shown in FIG. 9, as an example. In the case where the below-described mode to stop wafer transport to an individual unit block is selected, if pattern collapse is first detected in an inspected wafer W and pattern collapse is later detected in at least two of five later inspected wafers W which have passed through the same unit block as the first defective wafer W has passed through, then transport of subsequent wafers W to the unit block is stopped.

In the case where the below-described mode to stop wafer transport to an individual processing module is selected, if pattern collapse is first detected in an inspected wafer W and pattern collapse is later detected in at least two of five later inspected wafers W which have passed through the same processing module as the first defective wafer W has passed through, then transport of subsequent wafers W to the processing module is stopped. If pattern collapse is detected in zero or one of the five inspected wafers W, a later inspected wafer W in which pattern collapse is first detected after the inspection of the five preceding wafers W is newly taken as a first defective wafer W. Thus, if pattern collapse is later detected in at least two of five later inspected wafers W which have passed through the same unit block or the same processing module as the first defective wafer W has passed through, then transport of subsequent wafers W to the unit block or the processing module is stopped.

As shown in FIG. 9, transport stop criteria, which are similar to the transport stop criterion for pattern collapse, are set for poor resist dissolution and for bubbles after development. However, the transport stop criteria differ from the criterion for pattern collapse in that wafer transport to a relevant unit block B or processing module is stopped if a defect is first detected in an inspected wafer W and the same defect is later detected in at least one of five later inspected wafers W. In the case of the transport stop criterion for scum defect, shown in FIG. 9, wafer transport to a relevant unit block or processing module is stopped immediately after first detection of the defect in a wafer W. Such a transport stop criterion is set for each of the above-described inspection items. This prevents stop of wafer transport to a unit block or a processing module upon the accidental occurrence of a defect in a wafer W.

Returning to FIG. 7, a setting section 64 is connected to the bus 52. The setting section 64 is, for example, comprised of a keyboard and a mouse, a tough panel, or the like, and can set inspections to be performed in the inspection module 31. Inspections which can be set include inspection C1 after development and inspection C2 after resist formation; a user selects one of them. In the inspection C1 after development, a wafer W which has undergone developing processing In the fifth unit block B5 or the sixth unit block B6 is transported to the inspection module 31 and inspected. In the inspection C2 after resist film formation, a wafer W which has undergone resist film-forming processing in the first unit block B1 or the second unit block B2 is transported to the inspection module 31 and inspected.

In the case of selecting the inspection C1 after development, the user further selects a mode to stop wafer transport to a unit block(s) that a wafer W, in which an abnormality is detected, has passed through, or a mode to stop wafer transport to a processing module(s) that the wafer W has passed through. Three modes, mode D1, mode D2 and mode D3, are provided as modes to stop wafer transport to a unit block(s). The modes D1 to D3 differ in the unit block(s) to which transport of wafers is to be stopped after detection of an abnormality in a wafer W. In the mode D1, transport of subsequent wafers W to either one of the unit blocks B5, B6 is stopped. In the mode D2, in addition to either one of the unit blocks B5, B6, transport of subsequent wafers W to either one of the unit blocks B1, B2 is stopped. In the mode D3, transport of subsequent wafers W to either one of the unit blocks B1 B2, either one of the unit blocks B3, B4 and either one of the unit blocks B5, B6, is stopped.

Three lodes, mode D4, mode D5 and mode D6, are provided as modes to stop wafer transport to a processing module(s). The modes D4 to D6 differ in the processing module(s) to which transport of wafers is to be stopped after detection of an abnormality in a wafer W. In the mode D4, transport of subsequent wafers W to a particular processing module of the processing modules of the unit blocks B5, B6 is stopped. In the mode D5, in addition to a particular processing module of the processing modules of the unit blocks B5, B6, transport of subsequent wafers W to a particular processing module of the processing modules of the unit blocks B1, B2 is also stopped. In the mode D6, transport of subsequent wafers W to a particular processing module of the processing modules of the unit blocks B1, B2, a particular processing module of the processing modules of the unit blocks B3, B4 and a particular processing module of the processing modules of the unit blocks B5, B6, is stopped.

In the case of selecting the inspection C2 after resist film formation, the user further selects a mode D7 to stop wafer transport to a unit block(s) or a mode D8 to stop wafer transport to a processing module(s). The modes D1, D2, D3 correspond to the modes M2, M5, M6 recited in the claims, the modes D4, D5, D6 correspond to the modes M1, M3, M4, and the modes D7, D8 correspond to the modes N2, N1, respectively.

Further, the user can specify a wafer W to be inspected e.g. by specifying the ID of the wafer W via the setting section 64. To the bus 52 is also connected a display section 65 e.g. comprised of a liquid crystal display. A transport schedule, the results of inspection of each wafer for each inspection item, etc are displayed on the display section 65.

Mode D3

The mode D3 will now be described as a representative of the modes D1 to D3 which are to stop wafer transport to an individual unit block(s) and are employed when the inspection C1 after development is selected.

Wafer transport routes in the coating and developing apparatus 1 will be described with reference to FIGS. 11(a) and 11(b). The transport routes shown In the figures are employed in the case where the inspection C1 after development is selected and the mode D1 to stop wafer transport to an individual unit block is also selected. First, a wafer W is transported by the transfer arm 14 from a carrier C to the transfer module BU1. In the case where the wafer W is transported from the transfer module BU1 to the first unit block B1, the wafer W is transported by the transfer arm 30 to the hydrophobizing module ADH1 or ADH2, where the wafer W undergoes hydrophobizing processing, and the wafer W is then transported to the transfer module CPL1, as shown in FIG. 11(a).

The wafer W which has been transported to the transfer module CPL1 is transported by the main arm A1 in the following order: the antireflection film-forming module BCT1 or BCT2→one of the heating modules HP100 to HP109→the transfer module CPL2→the resist film-forming module COT1 or COT2→one of the heating modules HP100 to HP109→the peripheral exposure module WEE3 or WEE4→the transfer module CPL3. An antireflection film and a resist film are thus sequentially formed on the wafer W.

The wafer W is transported by the transfer arm 30 from the transfer module CPL3 to the transfer module CPL7 of the third unit block B3. Thereafter, the main arm A3 transports the wafer W in the following order: the protective film-forming module TCT1 or TCT2→one of the heating modules HP300 to HP311→the transfer module CPL8→the back surface cleaning module BST1 or BST2→the transfer module BU4. Thus, a protective film is formed on the wafer W and the back surface of the wafer W is cleaned.

Thereafter, the wafer W is transported by bye the interface arm 33 in the order of: one of the transfer modules CPL16 to CPL18→the interface arm 32→the exposure apparatus S4. Thus, the wafer W undergoes immersion exposure processing. After the exposure processing, the wafer W is transported in the flowing order: the interface arm 32→the transfer module TRS→the interface arm 33→the transfer module BU4→the interface arm 34→one of the post-exposure cleaning modules PER1 to PIR4→the interface arm 34→a support portion 43 in the transfer module BU4, lying in a height position corresponding to the fifth unit block B5.

Subsequently, the wafer W is transported by the main arm A5 in the following order: one of the heating modules HP500 to HP511→the transfer module CPL12→one of the developing modules DEV1 to DEV4→one of the heating modules HP500 to HP511→the transfer module CPL13→the transfer arm 30→the transfer module BU2→the inspection module 31. Thus, the wafer W is inspected after development. The wafer W after inspection is transported in the order of: the inspection module 31→the transfer arm 30→the transfer module BU1, and is returned by the transfer arm 13 to the carrier C. A wafer W which is not set to be inspected in the inspection module 31, after undergoing processing in one of the developing modules DEV1 to DEV4 and then in one of the heating modules HP500 to HP511, is transported in the following order: the transfer module CPL13→the transfer arm 30→the transfer module CPL0→the transfer arm 13→the carrier C.

Also in the case where a wafer W is transported from the buffer module BU1 to the unit blocks B2, B4, B6, the wafer W is subjected to the same processing as in the above-described case where a wafer is transported to the unit blocks B1, B3, B5. FIG. 11(b) shows a transport route in the case where a wafer W passes through the unit block B2, the unit block B4 and the unit block B6 in this order.

The transport route will now be briefly described. The wafer W is first transported in the order of the transfer arm 30→the hydrophobizing module ADH3 or ADH4→the transfer arm 30→the transfer module CPL4. Subsequently, the wafer W is transported by the main arm A2 in the following order: the antireflection film-forming module BCT3 or BCT4→one of the heating modules HP200 to HP209→the transfer module CPL5→the resist film-forming module COT3 or COT4→one of the heating modules HP200 to HP209→the peripheral exposure module WEE3 or WEE4→the transfer module CPL6. Thereafter, the substrate W is transported in the order of the transfer arm 30→the transfer module CPL9. Thereafter, the wafer W is transported by the main arm A4 in the following order: the protective film-forming module TCT3 or TCT4→one of the heating modules HP400 to HP411→the transfer module CPL10→the back surface cleaning module BST3 or BST4→the transfer module BU4.

In the interface block S3, the wafer W is transported in the same manner as the above-described wafer W after its transport to the third unit block B3 and undergoes exposure processing and post-exposure cleaning, and is then transferred to a support portion 43 in the transfer module BU4, lying in a height position corresponding to the sixth unit block B6. Thereafter, the wafer W is transported by the main arm A6 in the following order: one of the heating modules HP600 to HP611→the transfer module CPL14→one of the developing modules REVS to DEV8→one of the heating modules HP600 to HP611→the transfer module CPL15→the transfer module BU3→the transfer arm 30→the inspection module 31→the transfer arm 30→the transfer module CPL0→the carrier C. A wafer W which is not an inspection object, after developed and heated while transported along the foregoing transport route, is transported in the following order: the transfer module CPL15→the transfer arm 30→the transfer module CPL0→the transfer arm 13→the carrier C.

Figure 12:
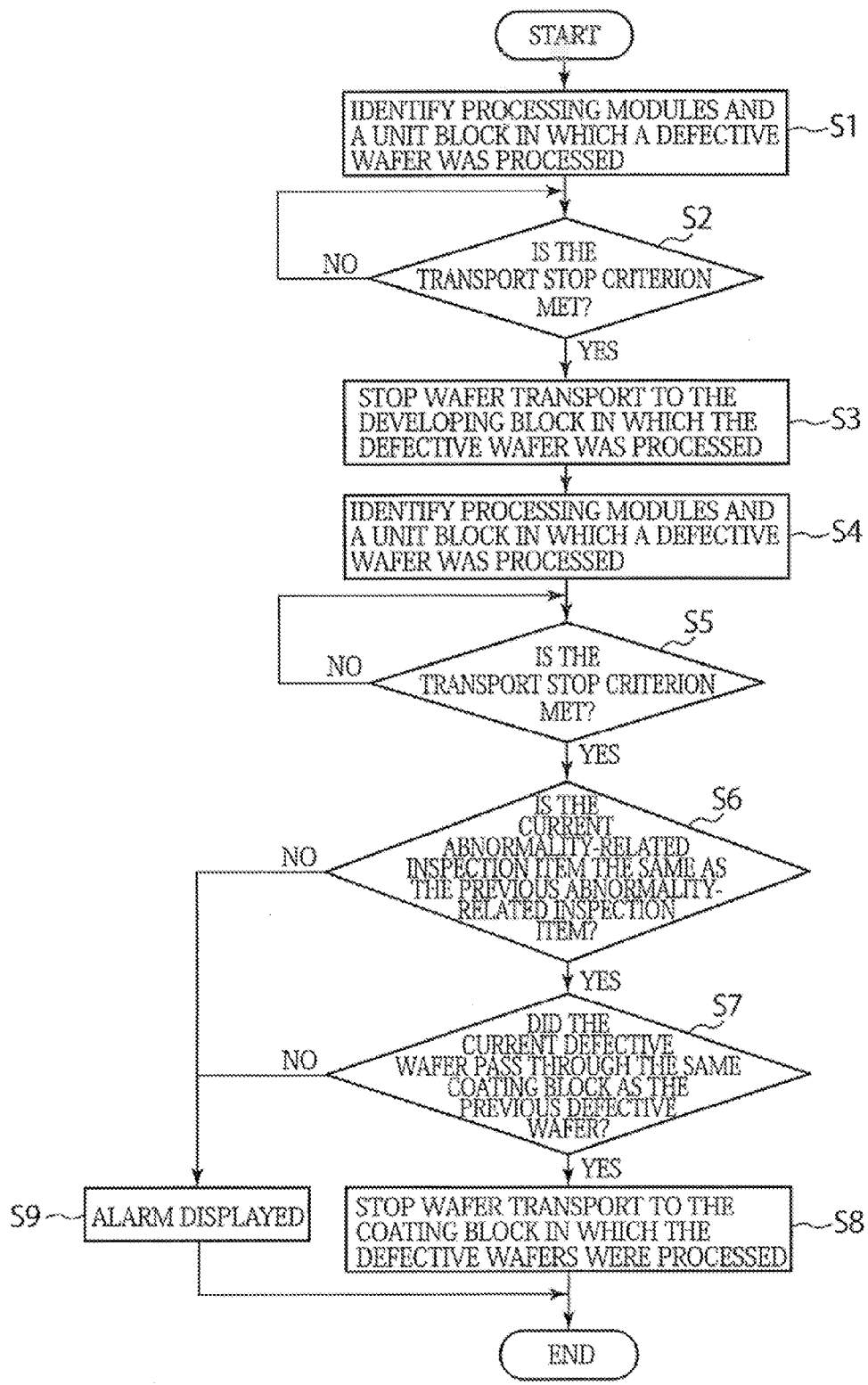
FIG. 12 is a flow chart illustrating the process of stopping transport of wafers to a unit block.

A process of stopping wafer transport to a unit block B by means of the control section 51 will now be described with reference to FIG. 12. While wafers W are transported along the above-described path, the determination program 56 determines the presence or absence of an abnormality for each of the above-described inspection items based on inspection data sent from the inspection module 31, and the results of determination are stored in the inspection results storage area 60 in the memory 61. Upon determination of an abnormality, the determination program 56, based on the transport schedule in the transport schedule storage area 63 in the memory 61, identifies processing modules and a unit block B that have processed the defective wafer W. Further, the ID of the wafer W, the abnormality-related inspection item, and the identified processing modules and unit block B are, in their relation, stored in the inspection results storage area 60 in the memory 61 (step S1).

Subsequently, the determination program 56, based on the past inspection history of wafers W stored in the inspection results storage area 60, determines if the transport stop criterion set for the inspection item is met (step S2). For example, as described above, in the case where the abnormality-related inspection item is pattern collapse, a determination is made, with reference to wafers W that have passed through the same block B, as to whether pattern collapse has occurred in at least two of five later inspected wafers W after the first occurrence of pattern collapse in a wafer W. If it is determined that the transport stop criterion is not met, processing of wafers W in the unit blocks B1 to B6 is continued.

If it is determined that the transport stop criterion is met, processing of wafers W is stopped in the processing modules of the unit block B5 or B6 which has carried out processing of the wafer W in which the abnormality has been detected in the step S1, and the operation of the main arm A is also stopped. The transport program 55 rewrites the transport schedule so that processing of wafers will be carried out by using the unit block B5 or B6 in which the operations of the processing modules and the main arm A are not stopped. Wafers W are then transported and processed according to the revised transport schedule (step S3).

Figure 13A:
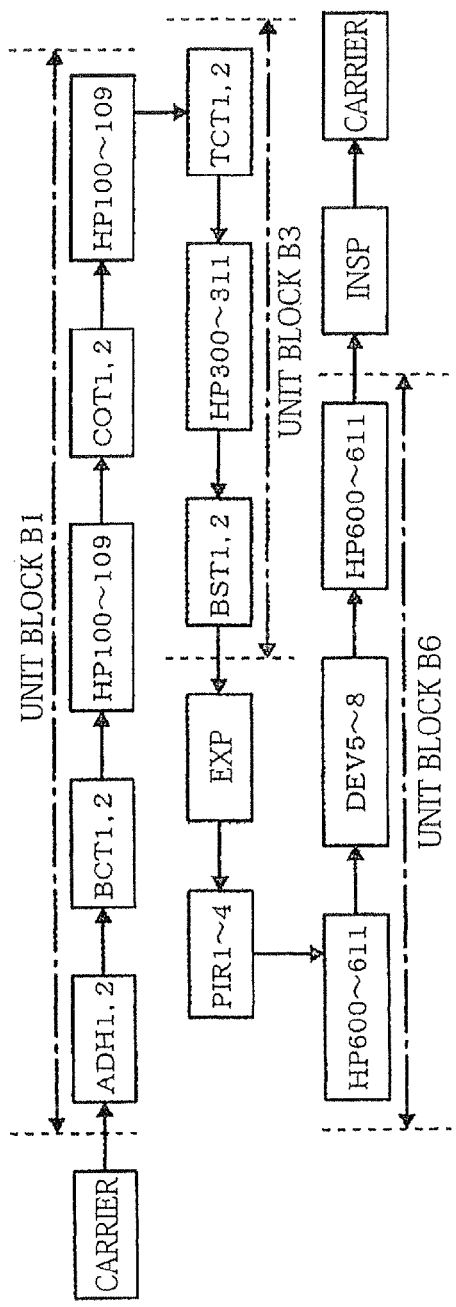
FIGS. 13(a) and 13(b) are diagrams illustrating wafer transport routes upon detection of an abnormality.
Figure 13B:
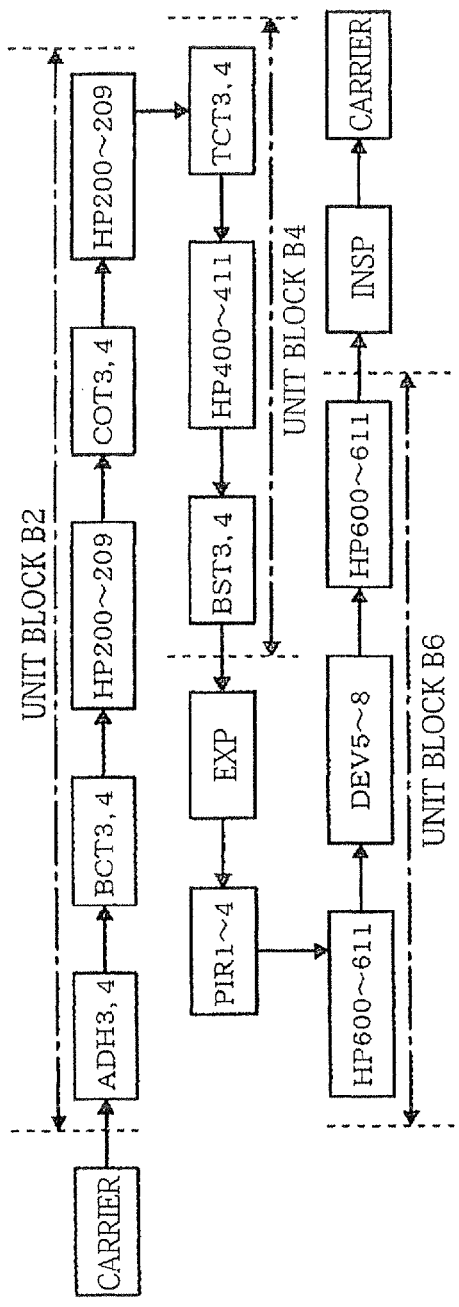

FIGS. 13(*a*) and 13(*b*) each show a transport route in the case where transport of wafers W to the fifth unit block B5 is stopped according to the above. As shown in the figures, all the wafers W that have undergone processing in the first to fourth unit blocks B1 to B4 are carried into the sixth unit block B6. On the contrary, in the case where wafer transport to the sixth unit block B6 is stopped, all the wafers W that have undergone processing in the first to fourth unit blocks B1 to B4 are carried into the fifth unit block B5.

Processing of wafers is thus continued by using only one of the developing blocks. When an abnormality is later detected in a wafer W, the procedure of the step S1 is followed. Thus, the determination program 56, based on the transport schedule in the transport schedule storage area 63 in the memory 61, identifies processing modules and a unit block B that have processed the defective wafer W. Further, the ID of the wafer W, the abnormality-related inspection item, and the identified processing modules and unit block B are, in their relation, stored in the memory 61 (step S4).

Subsequently, the determination program 56, based on the inspection history of wafers W after the stop of wafer transport to the unit block B5 or B6, determines if the transport stop criterion set for the relevant inspection item is met (step S5). If it is determined that the transport stop criterion is not met, processing of wafers W in the unit blocks B1 to B4 and B5 or B6 is continued.

If it is determined that the transport stop criterion is met, the determination program 56 determines whether the abnormality-related inspection item is the same as the inspection item for which an abnormality, which has caused the stop of the operation of the unit block B5 or B6 in the steps S2, S3, has previously been detected (step S6). If the inspection items are determined to be the same in the step S6, then the determination program 56 determines whether the coating block which the wafer W, determined to be abnormal in the step S4, has passed through is identical to the coating block which the wafer W, determined to be abnormal in the step S1, has passed through (step S7).

If the coating blocks are determined to be identical in the step S7, the abnormality in the inspection item is considered to be due to the processing in the coating block. Accordingly, the processing of wafers W in the coating block and the operation of the main arm A are stopped. Thus, the processing of wafers W in one of the pair of unit blocks B1 and B3 and the pair of unit blocks B2 and B4 is stopped. Further, the transport program 55 rewrites the transport schedule so that processing of wafers will be carried out by using those unit blocks of the unit blocks B1 to B4 which are in operation. Wafers W are then transported and processed according to the revised transport schedule (step S8).

Figure 11:
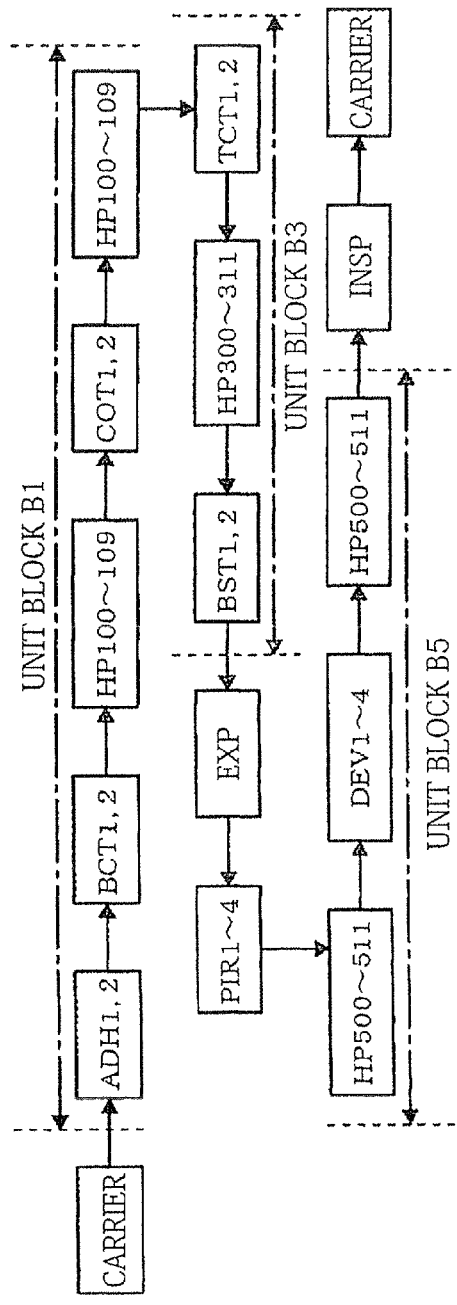
FIGS. 11(a) and 11(b) are diagrams illustrating wafer transport routes in the coating and developing apparatus.
Figure 11:
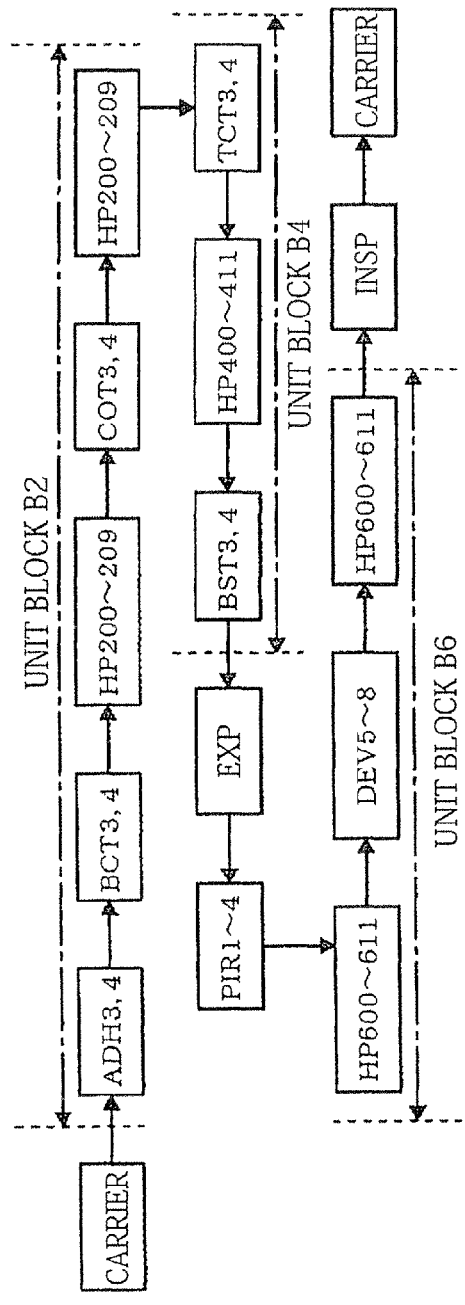

For example, when, after wafer transport to the unit block B5 is stopped as shown in FIG. 13, an abnormality occurs repeatedly and frequently in the same inspection item as that upon the stop of wafer transport to the unit block B5, wafer transport to the unit blocks B1, B3 is stopped according to the procedures of the steps S6 to S8. All the wafers W are then transported along the path: the unit block B2→the unit block B4→the unit block B6, as shown in FIG. 11(*b*).

If in the step S6 the abnormality-related inspection item is determined to be different from the previous abnormality-related inspection item upon the stop of the developing block, or if in the step S7 the coating blocks which respectively have processed the present and previous defective wafers are determined to be different, wafer transport to the unit blocks in operation is continued, and the inspection item which has been determined to meet the transport stop criterion in the step S5 is displayed on the display section 65 (step S9).

When the mode D1 or D2 is selected, approximately the same processing steps as in the above-described mode D3 are executed except for the following points: When the mode D1 is selected, the above-described steps S1 to S3 are executed. Thus, transport of wafers W to the unit blocks B1 to B4 is not stopped. When the mode D2 is selected, though the above-described steps S1 to S9 are executed, transport of wafers W to the unit blocks B3 and B4 is not stopped in the step S8.

Mode D7

A description will now be given of the case where the inspection C2 after resist film formation is set and the mode D7 to stop wafer transport to an individual unit block is selected. A wafer W is transported along the following path during the implementation of the inspection C2 after resist film formation: The wafer W which has undergone resist film-forming processing and has been carried into the transfer module CPL4 or CPL6, is carried by the transfer arm 30 into the inspection module 31, After inspection in the inspection module 31, the wafer W is carried into the third or fourth unit block via the transfer module CPL9 or CPL12. The wafer W after development is transported in the order of the transfer module CPL13 or CPL15→the transfer module BU11, and is returned to the carrier C. Except for such difference, the wafer W is transferred in the same manner as in the implementation of the inspection C1 after development.

Also in the mode D7, an abnormality in a wafer W is inspected for each inspection item as in the mode of inspection after development, and the processing of the steps S1 and S2 is executed. The processing is continued if it is determined that the transport stop criterion is not met in the step S2. If it is determined that the transport stop criterion is met, processing of wafers W is stopped in the processing modules of the unit block B1 or B2 which has carried out processing of a wafer W in which an abnormality has been detected, and the operation of the main arm A is also stopped. The transport program 55 rewrites the transport schedule so that processing of wafers will be carried out by using the unit block B1 or B2 in which the operations of the processing modules and the main arm A are not stopped.

Figure 14:
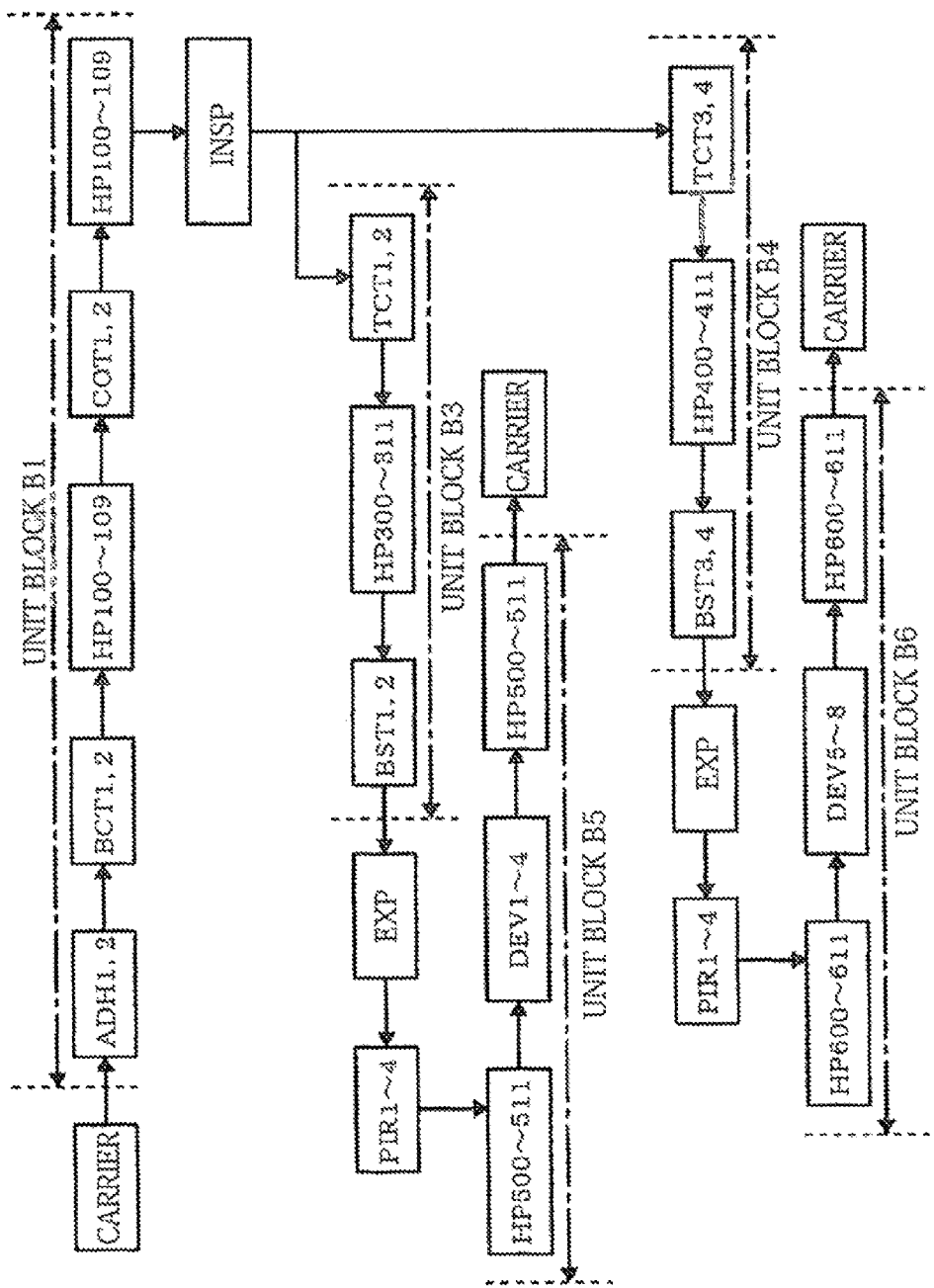
FIG. 14 is a diagram illustrating a wafer transport route upon detection of an abnormality.

FIG. 14 shows a transport route in the case where transport of wafers W to the second unit block B2 is stopped according to the above. As shown in the figure, subsequent wafers W are all carried from a carrier C into the first unit block B1. The wafers W are then directed from the first unit block B1 to one of the third and fourth unit blocks B3, B4. On the contrary, in the case where wafer transport to the first unit block B1 is stopped, subsequent wafers W are all carried from a carrier C into the second unit block B2.

Mode D6

Figure 15:
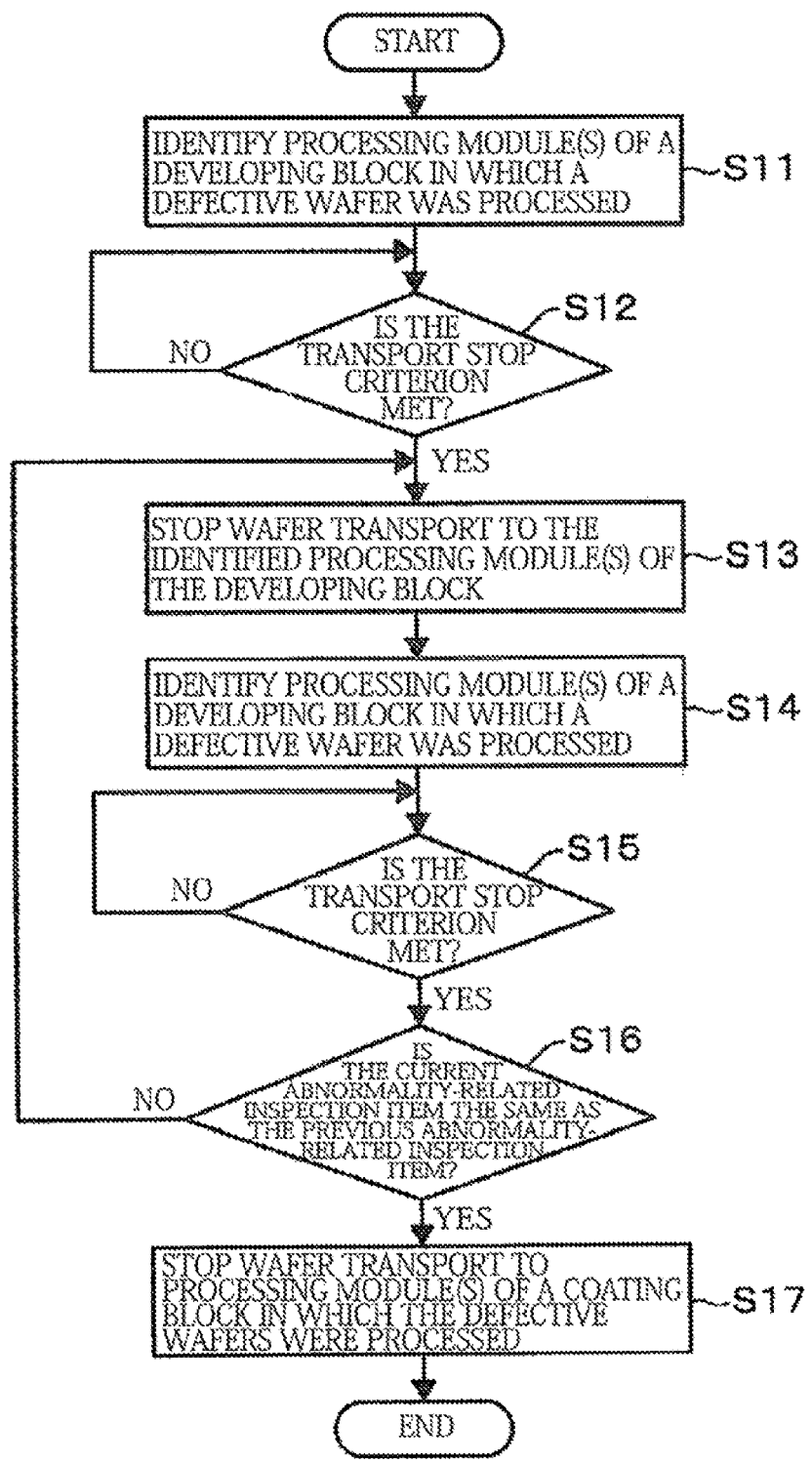
FIG. 15 is a flow chart illustrating the process of stopping transport of wafers to a processing module.

The mode D6 will now be described as a representative of the modes D4 to D6 which are to stop wafer transport to an individual processing module(s) and are employed when the inspection C1 after development is selected. A process flow during the implementation of the mode D6 will be described with reference to FIG. 15, focusing on differences from the mode D3. Upon detection of an abnormality in a wafer W, the determination program 56, based on the transport schedule, identifies those processing modules of the unit blocks B5, B6 which have processed the defective wafer W. Further, the ID of the wafer, the abnormality-related inspection item and the identified processing modules are, in their relation, stored in the memory 61 (step S11). Subsequently, the determination program 56, based on data stored in the inspection results storage area 60 in the memory 61, determines if any of the processing modules meets the transport stop criterion (step S12).

If it is determined that none of the processing modules meets the transport stop criterion, transport of wafers W to the processing modules is continued. If there is a processing module which meets the transport stop criterion, processing of a wafer W in the processing module is stopped (step S13). A transport schedule is set to perform wafer transport except the stopped processing module, and transport and processing of wafers W are continued.

When an abnormality occurs later in a wafer W, the determination program 56 stores the ID of the wafer W, the abnormality-related inspection item, and those processing modules of the developing unit blocks B5, B6 which have processed the defective wafer W, in their relation, in the inspection results storage area 60 in the memory 61 (step S14) as in the step S11. Further, as in the step S12, the determination program 56, based on data stored in the inspection results storage area 60 in the memory 61, determines if any of the processing modules, identified in the step 14, meets the transport stop criterion (step S15).

When there is an inspection item which meets the transport stop criterion, the determination program 56 determines whether the inspection item is the same as the inspection item relevant to the determination, made in the step 13, to stop wafer transport to the processing module (step S16). If the inspection items are determined to be not the same, the processing in the step S13 and in the subsequent steps is executed, and wafer transport to a processing module which meets the transport stop criterion is stopped in the developing unit block.

If the inspection items are determined to be the same in the step S16, the determination program 56, based on the transport schedule, identifies a processing module which has processed the wafer W, in which the abnormality has been detected in the step S14, in the unit blocks B1 to B4. Processing of a wafer W in the identified processing module is stopped. A transport schedule is set to perform wafer transport except the stopped processing module, and transport and processing of wafers W are continued (step S17). The phrase "perform wafer transport except the stopped processing module" has the following meaning: A wafer W, which has been set to be transported to the stopped module in a unit block, is transported to another module which performs the same processing as the stopped module in the unit block. Thus, if processing of a heating module in a unit block is stopped, wafers W are transported to another heating module in the same unit block. If processing of a liquid processing module in a unit block is stopped, wafers W are transported to another liquid processing module which is provided in the same unit block and which performs the same processing as the stopped liquid processing module. Thus, except for not transporting wafers W to an unusable processing module, wafers W are transported in the mode D6 along the same path as in the case of absence of an abnormality in any unit block, i.e. the path shown in FIG. 11.

A supplementary description will now be given of a processing module to which wafer transport is to be stopped upon the implementation of the mode D6. For example, in the case where pattern collapse is detected in a wafer W in the step S11 and the wafer W has undergone processing in the developing module DEV1 and the heating module 500, a determination is made as to whether the developing module DEV1 meets the transport stop criterion by referring to the past inspection results for wafers W which have undergone processing in the developing module DEV1. Further, a determination is made as to whether the heating module 500 meets the transport stop criterion by referring to the past inspection results for wafers W which have undergone processing in the heating module 500. If one of the developing module DEV1 and the heating module 500 is determined to meet the transport stop criterion, wafer transport to that processing module is stopped. A determination as to whether to meet the transport stop criterion is thus made for each relevant processing module, The pairs of the developing modules DEV1 and DEV2, the developing modules DEV3 and DEV4, the developing modules DEV5 and DEV6, and the developing modules DEV7 and DEV8 each share a nozzle 24. When a determination to stop wafer transport is made for one of a pair of developing modules which share a nozzle 24, the determination involves stop of wafer transport to the other one of the pair. Thus, when wafer transport to the developing module DEV1 is stopped, then wafer transport to the developing module DEV2 is also stopped. If wafer transport to the developing modules DEV3, DEV4 is not stopped, wafers W that have transported to the unit block B5 are processed in the developing modules DEV3, DEV4 and returned to the carrier C as described above. When the heating module 500 meets the transport stop criterion wafers W are transported to the other heating modules 501 to 511.

As regards the antireflection film-forming modules BCT1 to BCT4, the resist film-forming modules COT1 to COT4 and the protective film-forming modules TCT1 to TCT4, each pair of two liquid processing modules provided in each unit block shares one nozzle, Therefore, in order to prevent stop of processing in each unit block, wafer transport to these liquid processing modules is not stopped in the step S17. Instead, a liquid processing module which has processed a wafer W that meets the transport stop criterion in the step S15 and the relevant inspection item are, in their relation, displayed on the display section 65.

When the node D4 or D5 is selected, approximately the same processing steps as in the above-described mode D6 are executed except for the following points: When the mode D4 is selected, the above-described steps S11 to S13 are executed. Thus, the stop of transport of wafers W to a selected processing module in the unit blocks B1 to B4 is not executed. When the mode D5 is selected, though the above-described steps S11 to S17 are executed, the stop of transport of wafers W to a selected processing module in the unit blocks B3 and B4 is not executed in the step S17.

Mode D8

A description will now be given of the case where the inspection C2 after resist coating is set and the mode D8 to stop wafer transport to an individual processing module is selected. The following description will be focused on differences from the mode D6. During the implementation of the mode D8, transport of wafers W is performed in the same manner as in the mode D7. Thus, wafers W after processing in the unit block B1 or B2 are transported to the inspection module 31. When an abnormality is detected in a wafer W, as in the module D3, processing modules which have processed the wafer W are identified, and a determination is made as to whether the transport stop criterion is met for each of the identified processing modules. If any identified processing module meets the transport stop criterion, wafer transport to the processing module is stopped. Because wafers W after resist coating are inspected in the mode D8, the processing module is one which belongs to either the unit block B1 or the unit block B2. Wafer transport to a processing Module(s) is stopped based on the rule described above with reference to the mode D6. Thus, with reference to the antireflection film-forming modules BCT1 to BCT4 and the resist film-forming modules COT1 to COT4, even if any of these liquid processing modules meets the transport stop criterion, wafer transport to that processing module is continued.

In the coating and developing apparatus the antireflection film-forming modules BCT1 to BCT4 and the resist film-forming modules COT1 to COT4 are disposed in the unit blocks B1, B2, and the protective film-forming modules TCT1 to TCT4 and the back surface cleaning modules BST1 to BST4 are disposed in the unit blocks B3, B4. With reference to the unit blocks B1 to B4, two unit blocks having the same construction (B1 and B2, B3 and B4) are doubled and vertically stacked The developing unit blocks B5, B6, which are vertically doubled, are stacked on the unit blocks B1 to B4. The stacking of such doubled unit blocks enables small installation area of the processing block S2 while ensuring an appropriate depth dimension. Further, even when an abnormality occurs in one unit block of a doubled unit block or when one unit block is subjected to maintenance, such as repair upon a failure, periodic inspection, check of adjustment, etc., the other unit block can be used. This can reduce the lowering of the operation efficiency of the apparatus. When an abnormality is detected in a wafer W after development upon inspection by the inspection module 31, it is possible to take flexible measures depending on the situation, such as the operating rate, the number of subsequent wafers W to be processed, the state of the abnormality in the wafer W, etc., because of the provision of the modes which, based on data stored in the memory, transport subsequent wafers W to unit blocks other than a unit block(s) which the defective wafer W has passed through, and the modes which transport subsequent wafers W to modules other than a module(s) which the defective wafer W has passed through. Further, through selection of one of the modes D1 to D6, the user can select a unit block(s) to which wafer transport is to be stopped upon the occurrence of an abnormality in a wafer W, or a unit block(s) including a module(s) to which wafer transport is to be stopped. The coating and developing apparatus 1 is also provided with the modes D7, D8 which, based on the results of inspection of wafers W after resist coating, are to stop wafer transport to a unit block(s) or a processing module(s) which has processed a defective wafer W. The provision of the modes D1 to D8 enable the user to take more flexible measures depending on the situation upon detection of an abnormality. To construct a "doubled unit block", it is only necessary to design the two unit blocks so that the blocks can perform the same processing; the layout and the number of modules need not necessarily be made the same between the two unit blocks.

By executing the stop of wafer transport to a developing unit block and the stop of wafer transport to a coating unit block in a stepwise manner in the modes D2, D3 as described above, the stop of wafer transport to a coating unit block for which transport stop is unnecessary can be prevented. This can more securely reduce the lowering of the operation efficiency of the coating and developing apparatus 1. The method, however, is not limited to such stepwise stop of wafer transport to unit blocks. For example, when a developing defect which is partly due to a coating step, such as pattern collapse or a locally abnormal line width, is detected in a wafer W during the implementation of the mode D2 or D3, wafer transport to a developing unit block and a coating unit block which have processed the wafer W may be stopped simultaneously. Likewise in the modes D5, D6, wafer transport to a processing module of a developing unit block and wafer transport to a processing module of a coating unit block are stopped stepwise. The lowering of the operation efficiency of the coating and developing apparatus 1 can thus be reduced. However, wafer transport to these processing modules may be stopped simultaneously.

With reference to the liquid processing modules BCT1 to BCT4, COT1 to COT4, TCT1 to TCT4, BST1 to BST4 and DEV1 to DEV4, the stop of wafer transport may be controlled for an individual processing cup during the implementation of the mode D4, D5 or D6, Thus, transport of wafers W to the processing cup 23 of a processing module which has processed a wafer W in which an abnormality has occurred is stopped, whereas transport of wafers W to that processing cup 23 which shares a nozzle 24 with the stopped processing cup 23 may be continued. Further, with reference to the liquid processing modules BCT1 to BCT4, COT1 to COT4, TCT1 to TCT4, BST1 to BST4 and DEV1 to DEV4, when it is determined to stop wafer transport to a particular liquid processing module, it is possible to stop wafer transport to the unit block that includes the liquid processing module instead of stopping wafer transport to the liquid processing module.

In the case of stopping transport of wafers W to an individual processing cup 23 as described above, in order to adjust the number of wafers W to be processed in the apparatus, the apparatus may be operated in the following manner: For example, when nonuse of the processing cup 23 of one of the antireflection film-forming modules (BCT1 to BCT4) is determined, it is possible to set the apparatus not to use the processing cup 23 of one of the resist film-forming modules (COT1 to COT4) which lies In the same unit block. Similarly, when nonuse of the processing cup 23 of one resist film film-forming module (one of COT1 to COT4) is determined, it is possible to set the apparatus not to use the processing cup 23 of one antireflection film-forming module (one of BCT1 to BCT4) which lies in the same unit block, Further, also in the unit block having the same construction as the unit block in which wafer transport to the processing cup 23 of one of the resist film-forming modules (COT1 to COT4) and to the processing cup 23 of one of the antireflection film-forming modules (BCT1 to BCT4) is thus stopped, it is possible to stop wafer transport to the processing cup 23 of one of the resist film-forming modules and to the processing cup 23 of one of the antireflection film-forming modules in order to adjust the number of wafers W to be processed.

Figure 16:
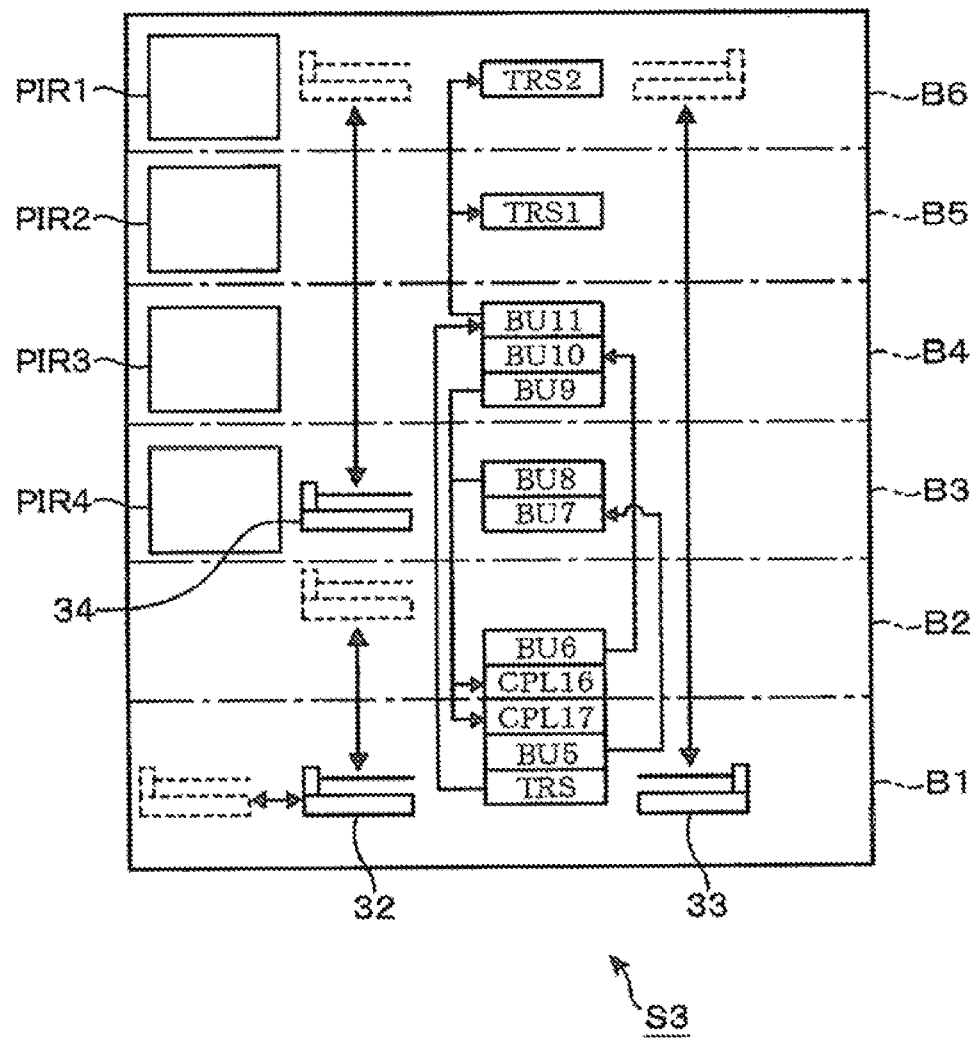
FIG. 16 is a vertical sectional front view of another interface block.

In the coating arid developing apparatus 1, the interface block S3 may be constructed as shown in FIG. 16. In this embodiment wafers W are transported from the unit block B1 or B2 to the unit block B3 or B4 via the interface block S3. The interface block S3 shown in FIG. 16 differs from that shown in FIG. 5 in the following respects: Transfer modules BU5, BU6 are provided in height positions corresponding to the unit blocks B1, B2, respectively. Transfer modules BU7, BU8 are provided in height positions corresponding to the unit block B3. Transfer modules BU9, BU11 are provided in height positions corresponding to the unit block B4. Transfer modules TRS1, TRS2 are provided in height positions corresponding to the unit blocks B5, B6, respectively. The interface block S3 is also provided with a transfer module BU11. The transfer modules are stacked on top of each other.

A Wafer w after processing in the unit block B1 or B2 is transported to the transfer module BU5 or BU6, and then transported by the interface arm 33 to the transfer module BU7 or BU8. The wafer W is then carried by the transfer arm A3 or A4 into the unit block B3 or B4, where the wafer W is processed. The wafer W after processing is transported to the transfer module BU9 or BU10, and then transported by the interface arm 33 to the transfer module CPL16 or CPL17. Subsequently, as with the embodiment shown in FIG. 5, the wafer W is transported in the order of the exposure apparatus S4→the transfer module TRS. Thereafter, the wafer W is transported in the flowing order: the transfer module TRS→the interface arm 33→the transfer module BU11→the interface arm 34→one of the post-exposure cleaning modules PIR1 to PIR4→the interface arm 34→the transfer module TRS1 or TRS2. The wafer W is then transported by the main arm A5 or A6 to the unit block B5 or B6.

In the above described embodiments, wafers W after processing in the protective film-forming modules TCT1 to TCT4 and heating in the heating modules HP300 to HP311 or HP400 to HP411, may be transported to the inspection module 31 for inspection of the wafers W. In that case, according to the procedures of the above-described modes, wafer transport may be stopped either for a unit block in which an antireflection film, a resist film and a protective film have been formed on a wafer W in which an abnormality has been detected or for a processing module belonging to the unit block and which has processed the defective wafer W.

In the above-described embodiments, instead of the protective film-foaling modules TCT1 to TCT4, it is possible to provide modules for forming an antireflection film over a resist film. Instead of carrying out hydrophobizing processing of wafers in the hydrophobizing modules ADH before the formation of an antireflection film in the antireflection film-forming modules BCT, it is possible to carry out the hydrophobizing processing after the formation of the antireflection film and before resist coating, or after resist coating and before transport of the wafers to the unit blocks B3, B4. The order of stacking of the unit blocks is not limited to that described above. For example, the fifth and sixth unit blocks for performing developing processing may be provided under the first and second unit blocks for forming a resist film. Further, though in the above-described embodiments the unit blocks of each doubled unit block have the same number of modules and the same layout, the number of modules and the layout may not necessarily be the same between the unit blocks insofar as the same processing can be performed for wafers W.

Second Embodiment

Figure 17:
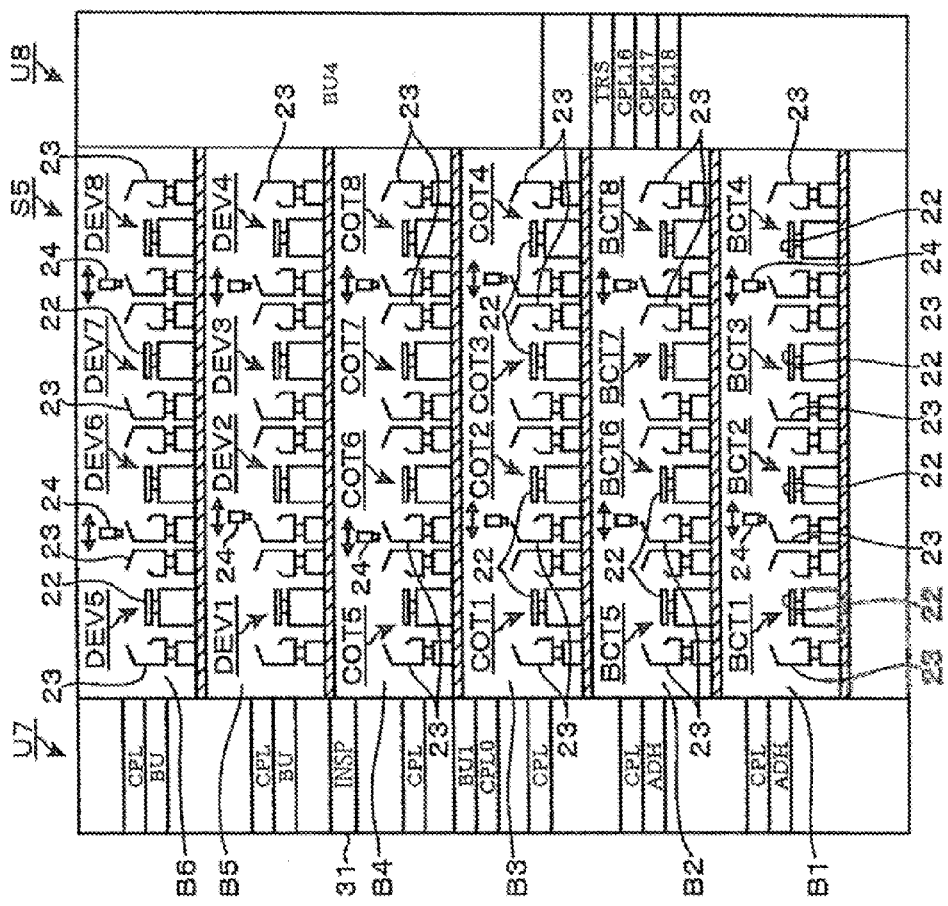
FIG. 17 is a vertical sectional side view of another processing block.

The processing block 5 of a coating and developing apparatus according to a second embodiment will now be described with reference to FIG. 17. In the processing block S5, a pair of unit blocks B1, B2 including antireflection film-forming modules (BCT1 to BCT8), a pair of unit blocks B3, B4 including resist film-forming modules (COT1 to COT8), and a pair of unit blocks B5, B6 including developing modules (DEV1 to DEV8) each constitute a doubled unit block. Each of the unit blocks B1 to B4 of the processing block S5 is the same in the mechanical construction as each of the unit blocks B1 to B4 of the processing block S2, though they differ in liquid processing preformed in their liquid processing modules. The unit blocks B1, B2, B3 and B4 of the processing block S5 are provided with the antireflection film-forming modules BCT1 to BCT4, the antireflection film-forming modules BCT5 to BCT8, the resist film-forming modules COT1 to COT4 and the resist film-forming modules COT5 to COT8, respectively, as liquid processing modules. As with the above-described liquid processing modules of the processing block S2, the liquid processing modules of the processing block S5 each have a processing cup 23. Two adjacent cups 23, arranged in a direction from the carrier block S1 toward the interface block S3 share a nozzle 24 for supplying a processing liquid to a wafer W.

The unit blocks B1 and B2 have the same construction, and the unit blocks B3 and B4 have the same construction. Wafers W are transferred between the unit blocks in the same manner as in the processing block S2. Thus, wafers W which have undergone processing in the unit blocks B1, B2 are transported to the unit blocks B3, B4 via the transfer modules CPL of the shelf unit U7 and the transfer arm 30. Further, the wafers W are transferred to the unit blocks B3 to B6 and the exposure apparatus S4 via the transfer modules of the shelf unit U8.

In the case of performing the above-described inspection C1 after development, a wafer W is transported and processed in the processing block S5 in the following order: the unit block B1 or B2→the unit block B3 or B4→the exposure apparatus S4→the unit block B5 or B6→the inspection module 31. In the case of performing the inspection C2 after resist coating, a wafer W is first transported and processed in the following order: the unit block B1 or B2→the unit block B3 or B4→the inspection module 31. Thereafter, the wafer W is carried into the interface block S3 via the shelf unit U7 and the unit block B3 or B4, and then transported and processed in the order of the exposure apparatus S4→the unit block B5 or B6.

Also in the coating and developing apparatus 1 having the processing block S5, the user can select one of the inspection modes D1 to D8. According to a selected mode, transport of wafers W to a unit block(s) or a processing module(s) can be stopped upon detection of an abnormality in a wafer W. Two pairs of processing cups 23, each pair sharing a nozzle 24, are provided in each layer of the processing block S5. When one of the modes D4 to D6 or the mode D8 is selected to stop wafer transport to a processing module(s), and the stop of wafer transport to a particular liquid processing module is determined, wafers W are transported to the other pair of liquid processing modules, which belongs to the same unit block as the particular liquid processing module and which does not share a nozzle 24 with the particular liquid processing module. For example, when the stop of wafer transport to the resist film-forming module COT1 is determined, subsequent wafers W are transported to the other pair of resist film-forming modules (COT3 and COT4) which does not share a nozzle 24 with the module COT1.

In the second embodiment, as in the first embodiment, even when a unit block(s) or a module(s), which has processed a wafer W in which an abnormality is detected, is stopped, processing of wafers W is continued in the other unit blocks or modules, While thus carrying out processing of wafers, the stopped unit block(s) or module(s) can be subjected to maintenance, such as repair upon a failure, periodic inspection, check of adjustment, etc. This can reduce the lowering of the throughput.

Third Embodiment

Figure 18:
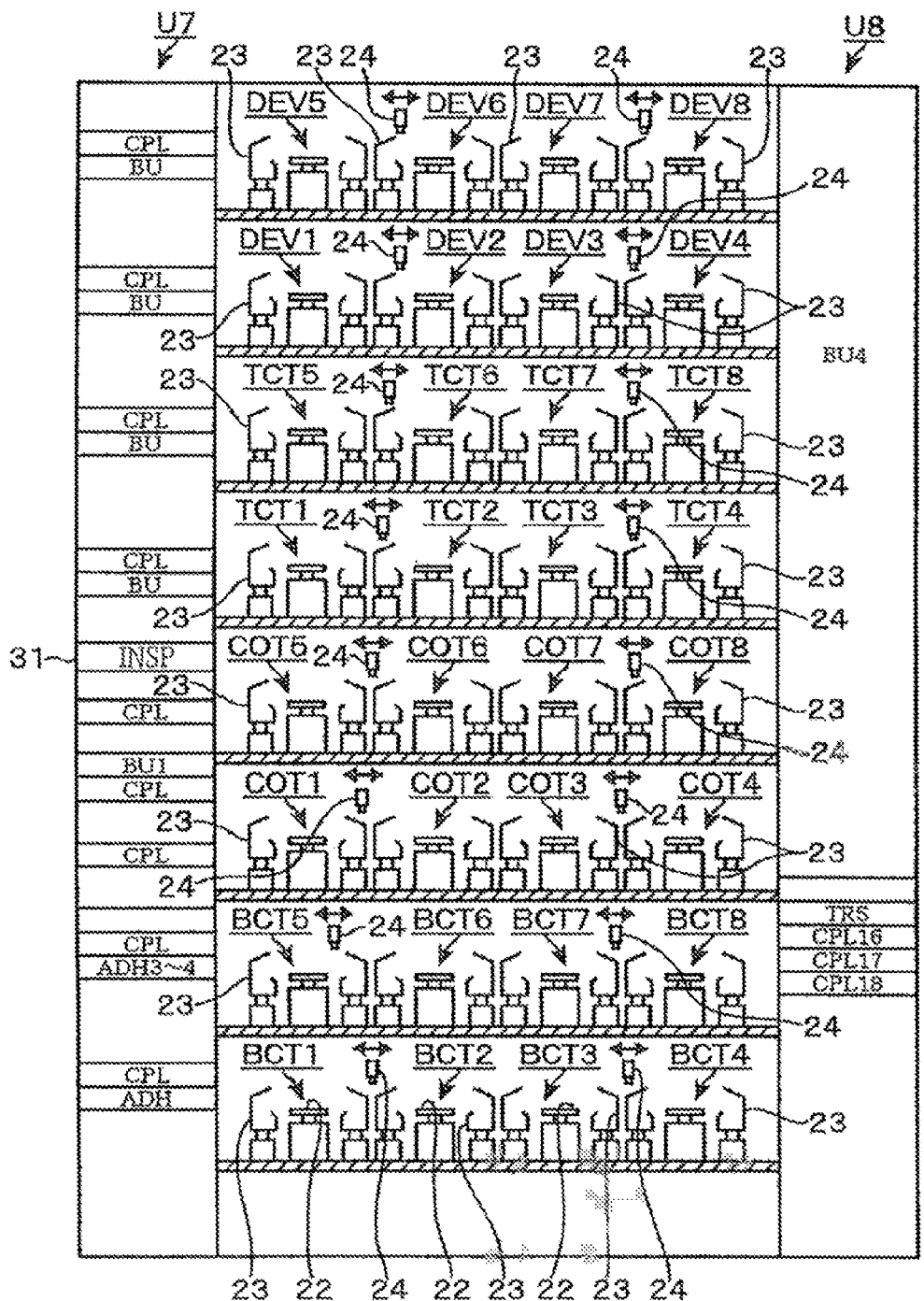
FIG. 18 is a vertical sectional side view of yet another processing block.

The processing block S6 of a coating and developing apparatus according to a third embodiment will now be described with reference to FIG. 18. The processing block S6 includes 8 unit blocks stacked in 8 stages. The eight unit blocks are herein referred to as E1, E2, E3, E4, E5, E6, E7 and E8 in the stacking order from the lowest one. In the processing block S6, the unit blocks E1 to E4 have the same construction as the unit blocks B1 to B4 of the processing block S5. The unit blocks E5 and E6, stacked on the unit block E4, have the same construction and are provided with protective film-forming modules TCT1 to TCT4 and TCT5 to TCT8, respectively, Each of the unit blocks E5 and E6 has the same mechanical construction as each of the unit blocks E1 to E4 except that different processing is performed by the liquid processing modules. The unit blocks E7, E8, stacked on the unit block E5, have the same construction as the unit blocks B5, B6 of the processing block S2 of the first embodiment. In the third embodiment, the unit blocks E1, E2 correspond to early-stage coating unit blocks and the unit blocks E3, E4 correspond to later-stage coating unit blocks. The unit blocks E5, E6 correspond to additional processing unit blocks.

Wafers W can be moved between the unit blocks E1 to E6 in the processing block S6 via the transfer modules CPL of the shelf unit U7 and the transfer arm 30. Further, the wafers W can be transferred between the unit blocks E5 to E8 and the exposure apparatus S4 via the transfer modules CPL of the shelf unit U8 and the interface arms 32 to 34. In the case of performing the inspection C1 after development, a wafer W is transported in the following order: the unit block E1 or E2→the unit block E3 or E4→the unit block E5 or E6→the exposure apparatus S4→the unit block B7 or B8→the inspection module 31. In the case of performing the inspection C2 after resist coating, a wafer W is transported and processed in the following order: the unit block E1 or E2→the unit block E3 or E4→the inspection module 31→the unit block E5 or E6→the exposure apparatus S4→the unit block B7 or B8.

Figure 19:
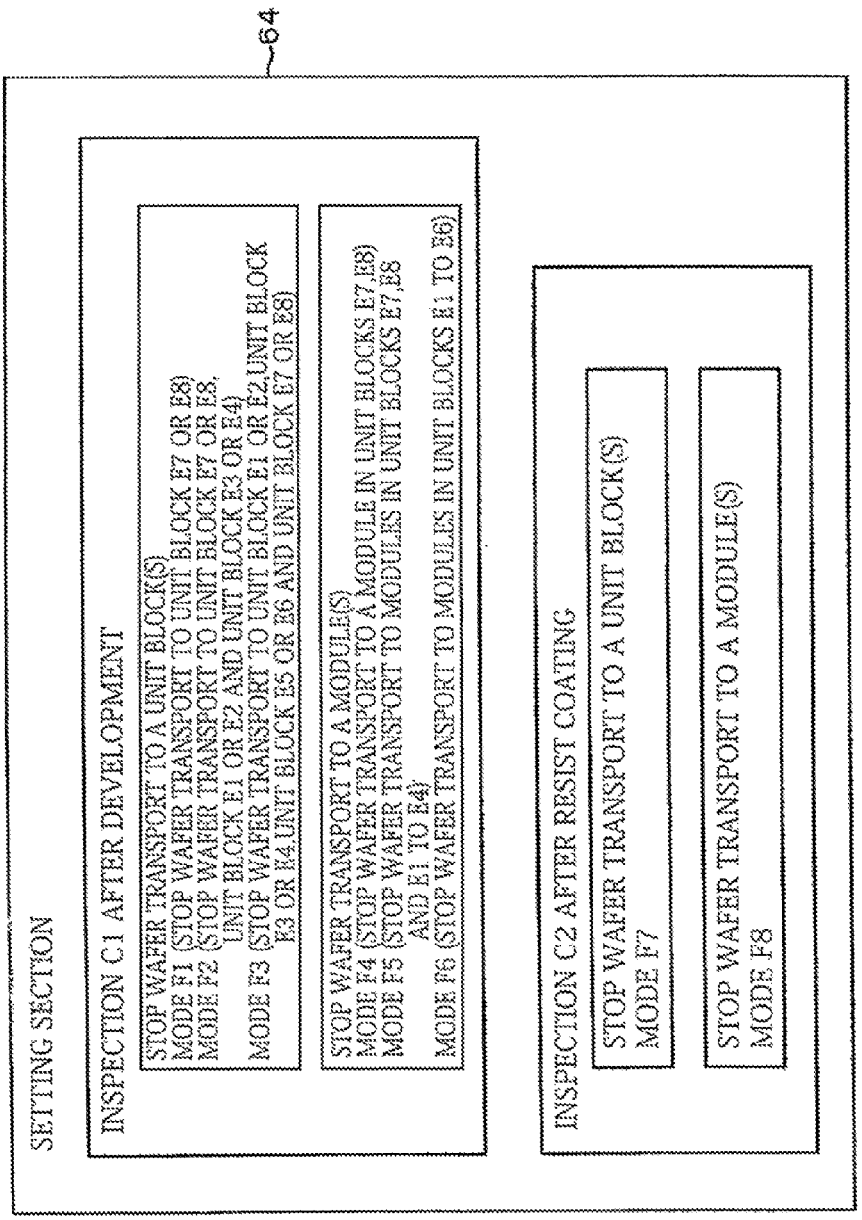
FIG. 19 is a diagram illustrating modes which are selectable via a setting section.

As with the first and second embodiments, the coating and developing apparatus having the processing block S6 is provided with various modes which control transport of wafers W based on the results of inspection by the inspection module 31, and can perform inspection of wafers W after development or after resist coating and before exposure. FIG. 19 shows inspection types and modes which are selectable via the setting section 64 of the coating and developing apparatus. The inspection C1 after development, performed in the coating and developing apparatus, involves modes F1 to F6 which correspond to the above-described modes D1 to D6, respectively.

In the mode F1, transport of wafers W to that one of the unit blocks E7, E8 which has processed a wafer W having an abnormality is stopped. In the mode F2, transport of wafers W to those unit blocks of the unit blocks E1 to E4, E7, E8 which have processed a wafer W having an abnormality is stopped. In the mode F3, transport of wafers W those unit blocks of the unit blocks E1 to E8 which have processed a wafer W having an abnormality is stopped. In the mode F4, transport of wafers W to a processing module which has processed a wafer W having an abnormality in the unit blocks E7, E8 is stopped. In the mode F5, transport of wafers W to processing modules which have processed a wafer W having an abnormality in the unit blocks E1 to E4, E7, E8 is stopped. In the mode F6, transport of wafers W to processing modules which have processed a wafer W having an abnormality in the unit blocks E1 to E8 is stopped.

The inspection C2 after resist coating, performed in the coating and developing apparatus 1, involves modes F7 and F8 which correspond to the above-described modes D7 and D8, respectively. In the mode F7, transport of wafers W to those unit blocks of the unit blocks E1 to E4 which have processed a wafer W having an abnormality is stopped. In the mode F8, transport of wafers W to processing modules which have processed wafer W having an abnormality in the unit blocks E1 to E4 is stopped, Also in the processing block S6 having the above construction, processing of wafers W can be continued while performing maintenance of a unit block(s) or a processing module(s) to which transport of wafers W has been stopped. Thus, the coating and developing apparatus of this embodiment can achieve the same advantageous effects as described above with reference to the preceding embodiments.

The invention claimed is:
1. A coating and developing apparatus comprising a carrier block, a processing block and an interface block connectable to an exposure apparatus, said coating and developing apparatus being configured to transfer each substrate, which has been carried by a carrier into the carrier block, to the process- ing block, form at least two coating films, including a resist film, on the substrate in the processing block, send the substrate to the exposure apparatus via the interface block, develop the substrate after exposure, which has returned via the interface block, in the processing block, and transfer the substrate to the carrier block, a) wherein the processing block includes:
a first and second coating unit blocks vertically stacked on each other, each of the coating unit blocks including: a plurality of processing modules, including liquid processing modules that each form a coating film necessary for exposure; heating modules that each heat the substrate; and a transport mechanism that moves along a linear transport passage, extending from a carrier block side to an interface block side, to transport the substrate between those processing modules;
a first and second developing unit blocks vertically stacked on each other, each of the developing unit blocks including: a plurality of processing modules, including liquid processing modules that each supply a developing solution; heating modules that each heat the substrate; and a transport mechanism that moves along a linear transport passage, extending from a carrier block side to an interface block side, to transport the substrate between those processing modules;
b) wherein the coating film includes a resist film;
wherein the processing block further includes:
c) transfer units, each of which is, respectively, provided on the carrier block side of the coating unit blocks and the developing unit blocks, to mediate transferring of the substrate to and from the transport mechanism of the corresponding unit block;
(d) a first transfer mechanism that transfers the substrate to the transfer units such that a plurality of the substrates contained in the carrier are distributed to the transfer units associated with the coating unit blocks, and that returns the substrate from the transfer units associated with the developing unit blocks to the carrier;
(e) a second transfer mechanism that receives the substrates before exposure which have been processed in the processing block, and transfers the substrate after exposure to the developing unit blocks while a plurality of the substrates are distributed to the developing unit blocks;
(f) a post-development inspection module that inspects the substrate after development;
(g) a storage section that stores data on a transfer route along which the substrate, selected as an inspection object, has been transported until the substrate undergoes inspection in the post-development inspection module; and
(h) a selection section that allows a user to select a transport mode from a plurality of transport modes, including first and second transport modes, for responding to after-development abnormalities, wherein each of the transport modes are performed based on the data stored in the storage section when abnormality of the substrate is detected;
wherein the first transport mode is a mode that identifies the processing modules in one of the developing unit blocks that have processed the substrate having the abnormality, and controls operation of the transport mechanism of said one developing unit block such that subsequent substrates are transported to the processing modules other than the identified processing module in said one developing unit block,
wherein the second transport mode is a mode that identifies one of the developing unit block that has processed the substrate having the abnormality, and controls operation of the second transfer mechanism such that subsequent substrates are transported to the developing unit block other than the identified developing unit block.

2. The coating and developing apparatus according to claim 1, wherein the plurality of transport modes further includes a third transport mode, and wherein the third transport mode identifies the processing modules in one of the developing unit blocks and one of the coating unit blocks that have processed the substrate having the abnormality, and controls operation of the transport mechanisms of said one developing unit block and said one coating unit block such that subsequent substrates are transported to the processing modules other than the identified processing modules.

3. The coating and developing apparatus according to claim 1, wherein the plurality of transport modes further includes a fourth transport mode, and wherein the fourth transport mode identifies the developing unit block and the coating unit block that have processed the substrate having the abnormality, and controls operation of the first and second transfer mechanisms such that the subsequent substrates are transported to the developing unit block and the coating unit block other than the identified developing unit block and the identified coating unit block.

4. The coating and developing apparatus according to claim 1, further comprising:
a post-coating inspection module that inspects the substrate after coated with the resist film and before exposure;
a storage section that stores data on a transfer route along which the substrate, selected as an inspection object, has been transported until the substrate undergoes inspection in the post-coating inspection module; and
a control section that controls transporting of subsequent substrates based on the data stored in the storage section, when abnormality of the substrate is detected,
wherein the control section identifies the processing modules in one of the coating unit blocks that have processed the substrate having the abnormality, and controls operation of the transport mechanism of said one coating unit block such that subsequent substrates are transported to the processing modules other than the identified processing modules in said one coating unit block.

5. The coating and developing apparatus according to claim 1, further comprising;
a post-coating inspection module that inspects he substrate after coated with the resist film and before exposure;
a storage section that stores data on a transfer route along which the substrate, selected as an inspection object, has been transported until the substrate undergoes inspection in the post-coating inspection module; and
a control section that controls transporting of subsequent substrates based on the data stored in the storage section, when abnormality of the substrate is detected,
wherein the control section identifies one of the coating unit blocks that has processed the substrate having the abnormality, and controls operation of the first transfer mechanism such that subsequent substrates are transported to the coating unit block other than the identified coating unit block.

6. The coating and developing apparatus according to claim 1,
each of the coating unit blocks includes, as the liquid processing modules, coating modules that that each supply a chemical liquid to form a lower antireflection film and coating modules that each supply a developing solution to form a resist film on the lower antireflection film.

7. A coating and developing method that employs a coating and developing apparatus, which includes a carrier block, a processing block and an interface block connectable to an exposure apparatus, said coating and developing apparatus being configured to transfer each substrate, which has been carried by a carrier into the carrier block, to the processing block, form at least two coating films, including a resist film, on the substrate in the processing block, send the substrate to the exposure apparatus via the interface block, develop the substrate after exposure, which has returned via the interface block, in the processing block, and transfer the substrate to the carrier block,
- a) wherein the processing block includes:
  a first and second coating unit blocks vertically stacked on each other, each of the coating unit blocks, including: a plurality of processing modules, including liquid processing modules that each form a coating film necessary for exposure; heating modules that each heat the substrate; and a transport mechanism that moves along a linear transport passage, extending from a carrier block side to an interface block side, to transport the substrate between those processing modules;
  a first and second developing unit blocks vertically stacked on each other, each of the developing unit blocks including: a plurality of processing modules, including liquid processing modules that each supply a developing solution; heating modules that each heat the substrate; and a transport mechanism that moves along a linear transport passage, extending from a carrier block side to an interface block side, to transport the substrate between those processing modules;
- b) wherein the coating film includes a resist film;
  wherein the processing block further includes:
- c) transfer units, each of which is, respectively, provided on the carrier block side of the coating unit blocks and the developing unit blocks, to mediate transferring of the substrate to and from the transport mechanism of the corresponding unit block;
- d) a first transfer mechanism that transfers the substrate to the transfer units such that a plurality of the substrates contained in the carrier are distributed to the transfer units associated with the coating unit blocks, that returns the substrate from the transfer units associated with the developing unit blocks to the carrier;
- e) a second transfer mechanism that receives the substrates before exposure which have been processed in the processing block, and transfers the substrate after exposure to the developing unit blocks while a plurality of the substrates are distributed to the developing unit blocks;
- f) a post-development inspection module that inspects the substrate after development, said coating and developing method including:
inspecting the substrate after development;
storing in the storage section, data on a transfer route along which the substrate, selected as an inspection object, has been transported until the substrate undergoes inspection in the post-development inspection module;
selecting one of first and second transporting modes and performing the selected transport mode when abnormality of the substrate is detected;
wherein:
the first transport mode is a mode that identifies the processing modules in one of the developing unit blocks that have processed the substrate having the abnormality based on the data stored in the storage section, and transports subsequent substrates to the processing modules other than the identified processing module in said one developing unit block;
the second processing mode is a mode that identifies one of the developing unit block that has processed the substrate having an abnormality based on the data stored in the storage section, and transports subsequent substrates to the developing unit block other than the identified developing unit block.

8. The coating and developing method according to claim 7, wherein the first transport mode not only identifies the processing modules in said one developing unit block that have processed the substrate having the abnormality but also identifies the processing modules in one of the coating unit blocks that have processed the substrate having the abnormality based on the data stored in the storage section, and transports the subsequent substrates to the processing modules other than the identified processing module in both of said one developing unit block and said one coating unit block.

9. The coating and developing method according to claim 7, wherein the second processing mode not only identifies said one developing unit block that has processed the substrate having the abnormality but also identifies one of the coating unit blocks that has processed the substrate having the abnormality based on the data stored in the storage section, and transports subsequent substrates to the coating unit block other than the identified coating unit block.

10. The coating and developing method according to claim 7, wherein said coating and developing apparatus further includes a post-coating inspection module that inspects the substrate after coated with the resist film and before exposure,
said coating and developing method further includes:
inspecting the substrate after coated with the resist film and before exposure;
storing in the storage section, data on a transfer route along which the substrate, selected as an inspection object, has been transported until the substrate undergoes inspection in the post-coating inspection module;
identifying the processing modules in one of the coating unit blocks that that have processed the substrate having the abnormality based on the data stored in the storage section and transporting subsequent substrates to the processing modules other than the identified processing modules in said one coating unit block, when abnormality of the substrate is detected.

11. The coating and developing method according to claim 7, wherein said coating and developing apparatus further includes a post-coating inspection module that inspects the substrate after coated with the resist film and before exposure,
said coating and developing method further includes:
inspecting the substrate after coated with the resist film and before exposure
storing in the storage section, data on a transfer route along which the substrate, selected as an inspection object, has been transported until the substrate undergoes inspection in the post-coating inspection module;
identifying the coating unit block that has processed the substrate having the abnormality based on the data stored in the storage section, instead of identifying the processing modules, and transporting subsequent substrates to the coating unit block other than the identified coating unit block, when abnormality of the substrate is detected.

12. A non-transitory storage medium storing computer program configured for execution of the coating and developing method according to claim 7 by a coating and developing apparatus.

* * * * *